United States Patent
Kim et al.

(10) Patent No.: US 10,043,985 B2
(45) Date of Patent: Aug. 7, 2018

(54) ORGANIC LIGHT EMITTING DISPLAY DEVICE

(71) Applicant: LG DISPLAY CO., LTD., Seoul (KR)

(72) Inventors: Dohan Kim, Goyang-si (KR); Sunghoon Joo, Paju-si (KR); Jungkeun Kim, Seoul (KR); Byungsoo Kim, Goyang-si (KR); Eunjung Park, Goyang-si (KR); Hyoseok Kim, Daejeon (KR); Seonkeun Yoo, Gunpo-si (KR); Hanbyeol Seok, Seoul (KR); Seunghee Yoon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 84 days.

(21) Appl. No.: 15/147,395

(22) Filed: May 5, 2016

(65) Prior Publication Data

US 2017/0054084 A1    Feb. 23, 2017

(30) Foreign Application Priority Data

Aug. 21, 2015 (KR) .................. 10-2015-0117721

(51) Int. Cl.
  *H01L 51/00* (2006.01)
  *H01L 51/50* (2006.01)
  *H01L 51/52* (2006.01)

(52) U.S. Cl.
  CPC ...... *H01L 51/0072* (2013.01); *H01L 51/0052* (2013.01); *H01L 51/0054* (2013.01); *H01L 51/0058* (2013.01); *H01L 51/0067* (2013.01); *H01L 51/5044* (2013.01); *H01L 51/504* (2013.01); *H01L 51/5028* (2013.01); *H01L 51/5072* (2013.01); *H01L 51/5092* (2013.01); *H01L 51/5278* (2013.01)

(58) Field of Classification Search
  CPC ............. H01L 51/0072; H01L 51/0052; H01L 51/0067; H01L 51/0068; H01L 51/0073; H01L 51/5072; H01L 51/5088; H01L 51/504; H01L 51/0058; H01L 51/0054; H01L 51/0074; H01L 51/5092; H01L 51/5278

USPC .................. 428/690, 411.1; 252/301.16, 582
See application file for complete search history.

(56) References Cited

U.S. PATENT DOCUMENTS

| | | | |
|---|---|---|---|
| 2015/0097167 A1 | 4/2015 | Song et al. | |
| 2015/0144897 A1* | 5/2015 | Kang | H01L 51/5076 257/40 |
| 2015/0303380 A1* | 10/2015 | Kambe | C07D 487/14 257/40 |
| 2015/0311453 A1* | 10/2015 | Tsuji | C07D 413/14 257/40 |
| 2016/0043327 A1* | 2/2016 | Yoo | H01L 51/504 257/40 |
| 2017/0346023 A1* | 11/2017 | Jankus | H01L 51/5068 |
| 2017/0346037 A1* | 11/2017 | Huang | H01L 51/5278 |

FOREIGN PATENT DOCUMENTS

| | | | |
|---|---|---|---|
| EP | 2 833 700 A1 | 2/2015 | |
| KR | 10-1537500 B1 | 7/2015 | |
| KR | 10-2015-0115688 A | 10/2015 | |
| WO | WO-2013145666 A1 * | 10/2013 | ........... C07D 487/14 |

OTHER PUBLICATIONS

CAS reg. No. 1877378-14-7, Mar. 1, 2016. (Year: 2016).*

* cited by examiner

*Primary Examiner* — Douglas J McGinty
(74) *Attorney, Agent, or Firm* — Birch, Stewart, Kolasch & Birch, LLP

(57) ABSTRACT

An organic light emitting display device is discussed. The organic light emitting display device can include at least two or more light emitting parts each including a light emitting layer and an electron transport layer; and a charge generation layer between the two or more light emitting parts and including an N-type charge generation layer, wherein the electron transport layer includes an electron transport compound including a functional group with high electron mobility, and the N-type charge generation layer includes a charge generation compound including a functional group for matching the energy level of the electron transport compound.

12 Claims, 5 Drawing Sheets

ORGANIC LIGHT EMITTING DISPLAY DEVICE

This application claims the priority benefit of Korean Patent Application No. 10-2015-0117721 filed on Aug. 21, 2015, which is hereby incorporated herein by reference for all purposes as if fully set forth herein.

BACKGROUND

Field of the Invention

The present disclosure relates to an organic light emitting display device, and more particularly, to an organic light emitting display device which can reduce operating voltage and improve efficiency or lifetime.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc. is actively under way.

Among these types of panel displays, the OLED devices are a type of devices that emit light as electrons and holes are paired and then extinguished, when a charge is injected into an organic light emitting layer between an anode and a cathode. The OLED devices are advantageous in that they can be formed on a flexible transparent substrate such as plastic, and can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc. are important, so research and development are being done depending on which of these features should be taken into account. White OLED device structures may be roughly classified into a single-layer emitting structure and a multi-layer emitting structure. Among these structures, the multi-layer emitting structure having a blue fluorescent emitting layer and a yellow phosphorescent emitting layer stacked in tandem is mainly employed to realize white OLED devices with long lifetime.

Specifically, a stack structure of first and second light emitting parts is used, with the first light emitting part using a blue fluorescent diode as a light emitting layer, and the second light emitting part using a yellow phosphorescent diode as a light emitting layer. Such a white OLED device produces white light by mixing blue light emitted from the blue fluorescent diode and yellow light emitted from the yellow phosphorescent diode. A charge generation layer is between the first light emitting part and the second light emitting part to double the current efficiency generated in the light emitting layers and facilitate charge distribution. The charge generation layer comprises an N-type charge generation layer and a P-type charge generation layer.

However, the overall operating voltage of a device having the aforementioned multilayer emitting structure may be higher than the sum of the operating voltages of individual light emitting parts, or the multilayer emitting display device may decrease in efficiency compared to a single-layer emitting structure. Especially, if the N-type charge generation layer is doped with an alkali metal or alkali earth metal, the lifetime of the device may be decreased. Also, the difference in LUMO (lowest unoccupied molecular orbital) energy level between the P-type charge generation layer and the N-type charge generation layer deteriorates the property of injecting electrons generated at the interface between the P-type charge generation layer and the hole transport layer into the N-type charge generation layer. Moreover, electron injection from the N-type charge generation layer to the electron transport layer cannot be facilitated due to the difference in LUMO energy level between the electron transport layer and the N-type charge generation layer, resulting in a decrease in the performance or lifetime of the device.

SUMMARY

Accordingly, the present disclosure is directed to an organic light emitting display device which can reduce operating voltage and improve efficiency or lifetime.

To achieve these and other advantages and in accordance with the purpose of the invention, as embodied and broadly described, an exemplary embodiment of the present invention provides an organic light emitting display device comprising at least two or more light emitting parts each comprising a light emitting layer and an electron transport layer; and a charge generation layer between the at least two or more light emitting parts and including an N-type charge generation layer, wherein the electron transport layer includes an electron transport compound including a functional group with high electron mobility, and the N-type charge generation layer includes a charge generation compound including a functional group for matching the energy level of the electron transport compound.

An electron transfer from the N-type charge generation layer to the electron transport layer is facilitated by the functional group for matching the energy level of the electron transport compound.

The functional group for matching the energy level of the electron transport compound comprises a naphthyl group.

The functional group with high electron mobility comprises a p-biphenyl group.

The charge generation compound further comprises a functional group with high electron mobility.

The electron transport compound includes a triazine compound, and the charge generation compound includes a phenanthroline compound.

The electron transport layer and the N-type charge generation layer adjoin each other.

The electron transport compound is represented by the following Chemical Formula 1:

[Chemical Formula 1]

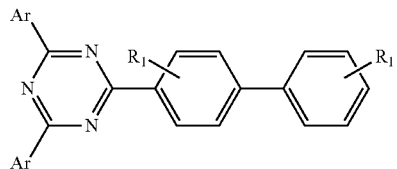

wherein Ar includes a substituted or unsubstituted aryl group of 6 to 30 carbon atoms, $R_1$ and $R_2$ include independently one among a substituted or unsubstituted alkyl group of 1 to 6 carbon atoms, a substituted or unsubstituted cycloalkyl group of 1 to 6 carbon atoms, and a substituted or unsubstituted aryl group of 6 to 30 carbon atoms.

Further, Ar includes one among the following compounds:

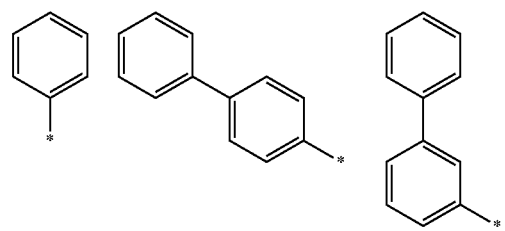

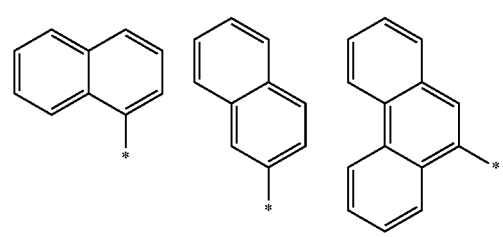

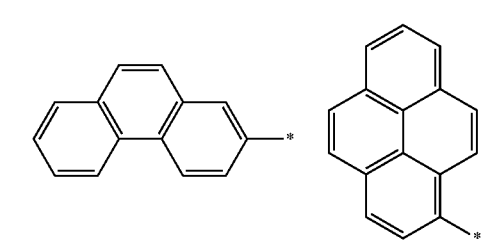

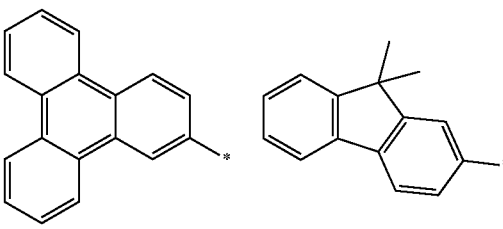

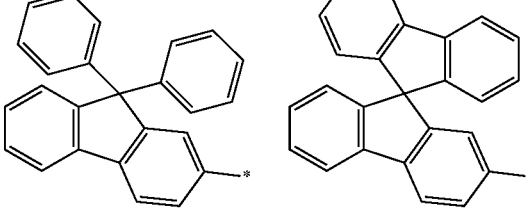

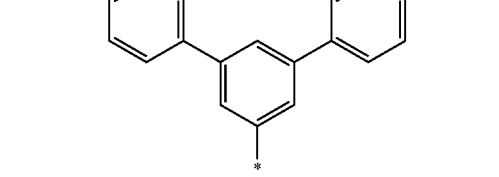

-continued

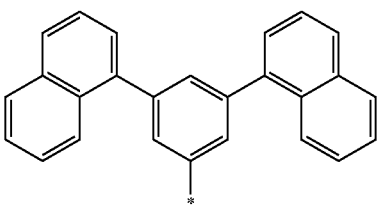

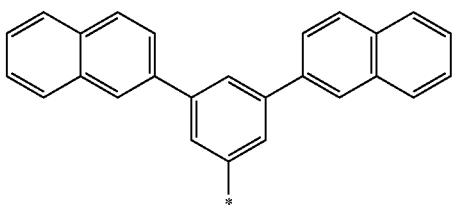

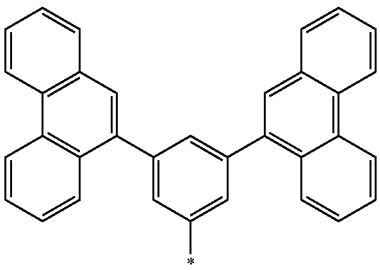

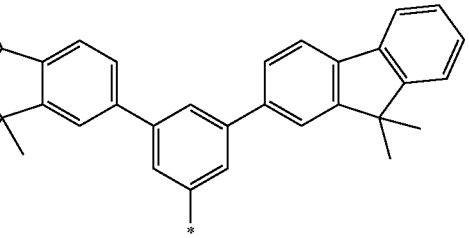

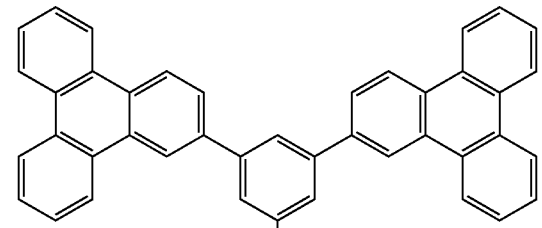

Furthermore, $R_1$ and $R_2$ include independently one among the following structures:

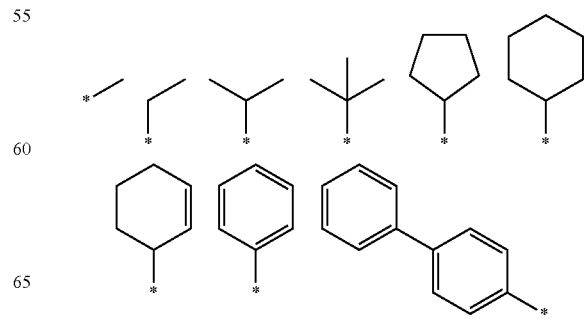

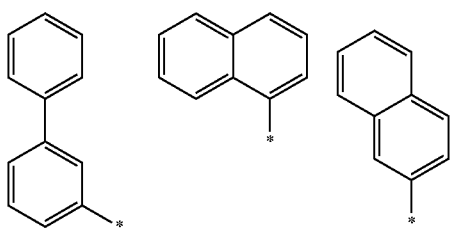
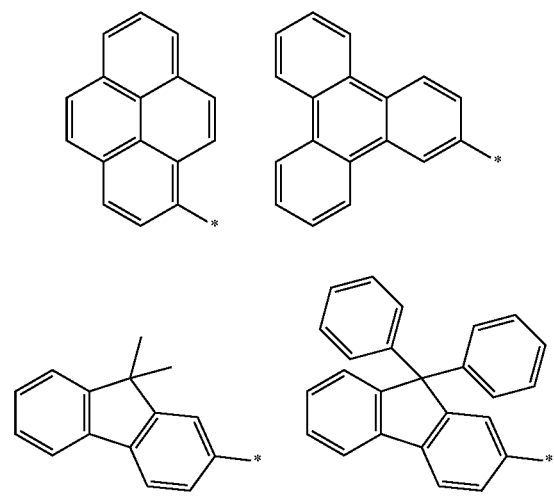
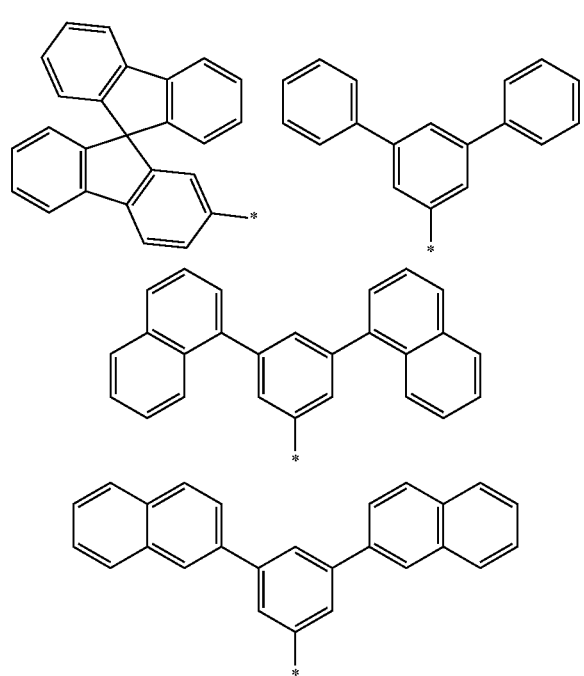
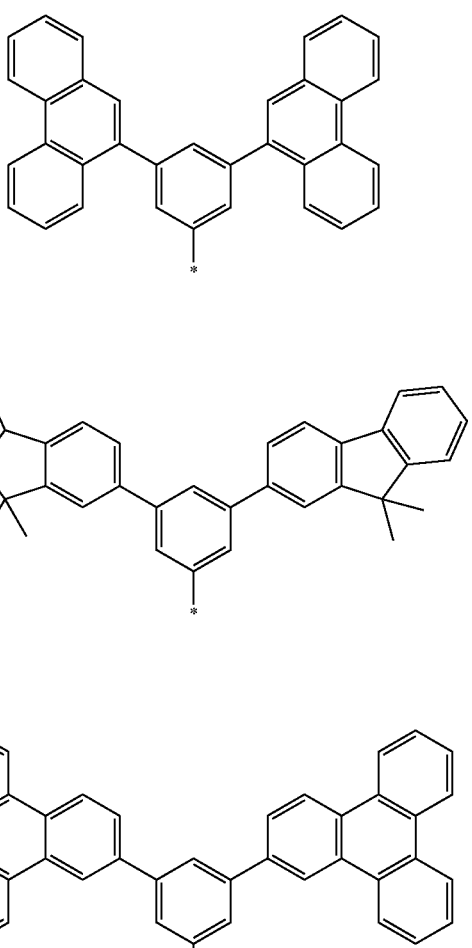
The compound represented by Chemical Formula 1 includes one among the following compounds:
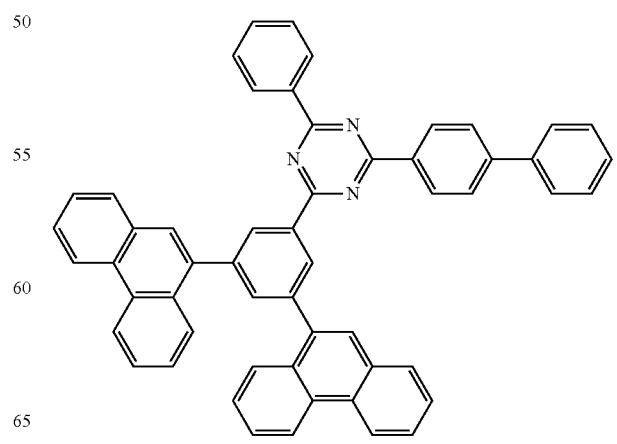

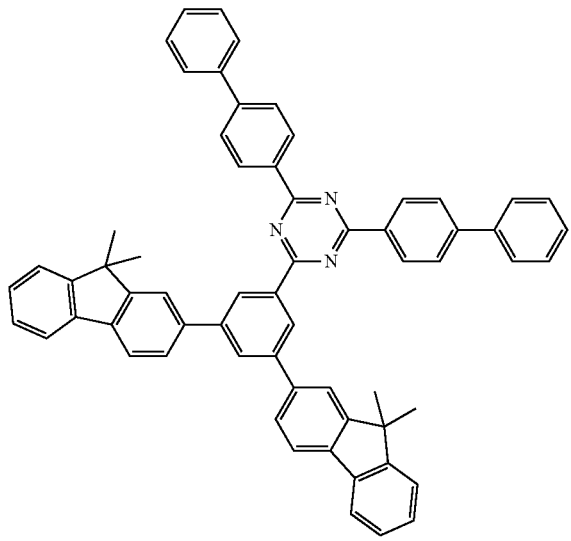

The charge generation compound is represented by the following Chemical Formula 2:

[Chemical Formula 2]

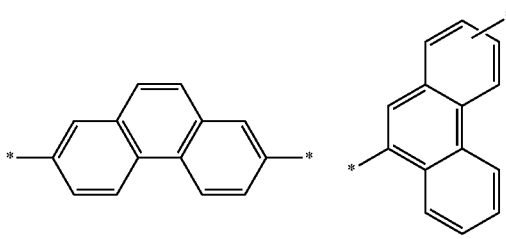

wherein X includes a substituted or unsubstituted naphthyl group, Y includes a substituted or unsubstituted aryl group with at least three or more ring structures, Z includes a phenyl group that is substituted or unsubstituted by an alkyl group, an aryl group, or a heteroaryl group, and o is 0 or 1.

Further, X includes one among the following compounds:

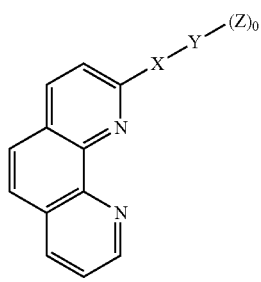

Furthermore, Y includes one among the following compounds:

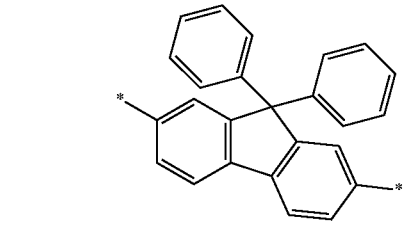

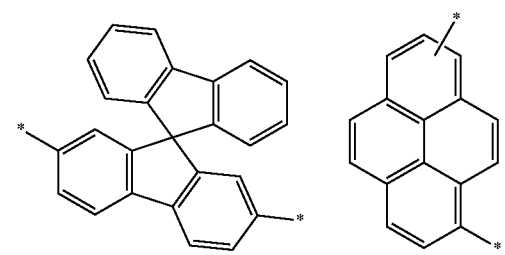

The charge generation compound represented by Chemical Formula 2 is one among the following compounds:

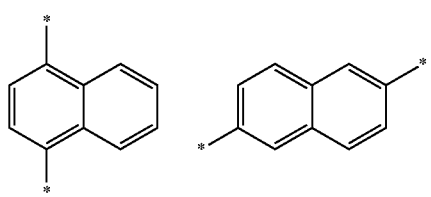

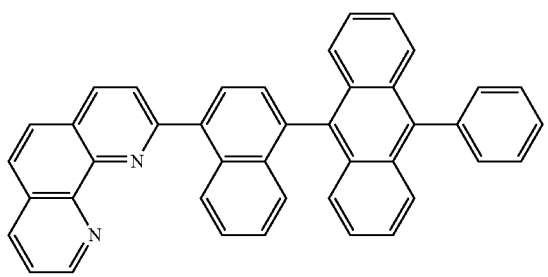

-continued

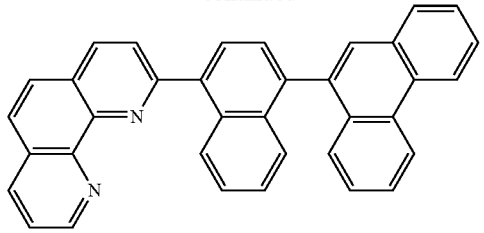

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
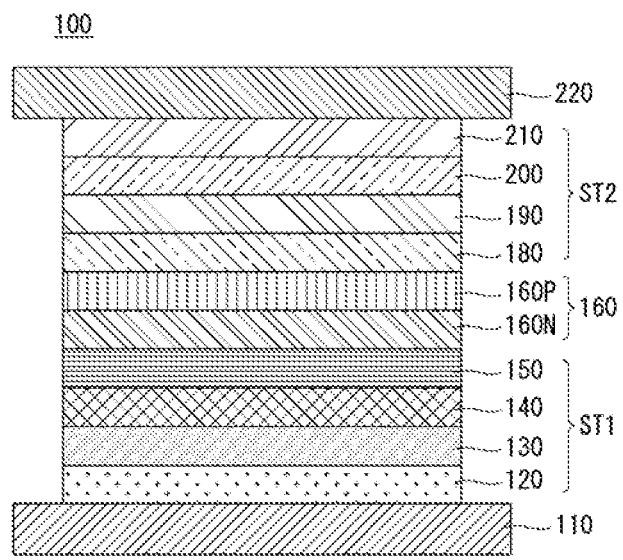
FIG. 1 is a cross-sectional view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims The shapes, sizes, percentages, angles, numbers, etc. shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include a margin of error even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be linked or combined with one another partly or wholly, and may technically interact or work together in various ways. The exemplary embodiments may be carried out independently or in combination with one another.

Hereinafter, various exemplary embodiments of the present disclosure will be described in detail with reference to the accompanying drawings.

FIG. 1 is a cross-sectional view showing an organic light emitting display device according to a first exemplary embodiment of the present disclosure. All the components of the organic light emitting display device according to all embodiments of the present disclosure are operatively coupled and configured.

Referring to FIG. 1, an organic light emitting display device 100 according to the first exemplary embodiment of the present disclosure comprises first and second light emitting parts ST1 and ST2 between an anode 110 and a cathode 220, and a charge generation layer 160 between the first light emitting part ST1 and the second light emitting part ST2.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The first light emitting part ST1 is a single light emitting diode unit, and comprises a hole injection layer 120, a first hole transport layer 130, a first light emitting layer 140, and a first electron transport layer 150.

The hole injection layer 120 may function to facilitate hole injection from the anode 110 to the first light emitting layer 140, and may be formed of, but is not limited to, one or more among CuPc (copper phthalocyanine), PEDOT (poly(3, 4)-ethylenedioxythiophene), PANI (polyaniline), and NPD (N,N'-bis(naphthalene-1-yl)-N,N'-bis(phenyl)-2, 2'-dimethylbenzidine). The hole injection layer 120 may have a 1 to 150 nm thickness. If the hole injection layer 120 has a 1 nm thickness or greater, the hole injection properties may be improved, or if the hole injection layer 120 has a 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The first hole transport layer 130 may function to facilitate hole transport, and may be formed of, but is not limited to, one or more among NPD (N,N'-bis(naphthalene-1-yl)-N,N'-bis(phenyl)-2,2'-dimethylbenzidine), TPD (N,N'-bis-(3-methylphenyl)-N,N'-bis(phenyl)-benzidine), spiro-TAD (2,2'7,7'-tetrakis(N,N-diphenylamino)-9,9'-spirofluorene), and MTDATA (4,4',4"-Tris(N-3-methylphenyl-N-phenylamino)-triphenylamine). The first hole transport layer 130 may have a 1 to 150 nm thickness. If the first hole transport layer 130 has a 1 nm thickness or greater, the hole transport properties may be improved, or if the first hole transport layer 130 has a 150 nm thickness or less, an increase in the thickness of the first hole transport layer 130 may be prevented, and a rise in operating voltage may be therefore prevented.

The first light emitting layer 140 may emit light of red (R), green (G), blue (B), or yellow (Y), and may be formed of a phosphorescent or fluorescent material. In this exemplary embodiment, the first light emitting layer 140 may be a blue light emitting layer, for example. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, a blue light emitting layer and a yellow-green light emitting layer, or a blue light emitting layer and a green light emitting layer.

If the first light emitting layer 140 is a blue light emitting layer, it may be formed of a phosphorescent material comprising a host material such as CBP (4,4'-bis(carbazole-9-yl)biphenyl) and a dopant material having an iridium-based material. Alternatively, the first light emitting layer 140 may be formed of, but is not limited to, a fluorescent material including one among spiro-BDAVBi (2,7-bis)4-diphenylamino)styryl)-9,9-spirofluorene, spiro-CBP (2,2',7,7'-tetrakis(carbazol-9-yl)-9,9-spirofluorene), distyrylbenzene (DSB), distyrylarylene (DSA), a polyfluorene (PFO) polymer, and a polyphenylnevinylene(PPV) polymer.

The first electron transport layer 150 functions to facilitate electron transport. If the electron transport is not smooth, electrons are not injected into the first light emitting layer 140. This lowers the chance of generating an exciton by the recombination of electron and hole in the light emitting layer 140. Due to this, the first light emitting layer 140 does not contribute to light emission, thus affecting the lifetime or efficiency of the organic light emitting display device. Thus, the present inventors conducted several tests or experiments to improve the electron injection properties of the electron transport layer. Through a number of tests or experiments which were performed on materials that do not affect the efficiency, etc. of the organic light emitting display device and that cause no rise in operating voltage, a compound comprising a functional group with high electron mobility was chosen as the electron transport layer. The compound of this disclosure makes electron transport from the electron transport layer to the light emitting layer easy by comprising a functional group with high electron mobility. Moreover, the compound of this disclosure may increase the thermal stability of the material by introducing a p-biphenyl group on a triazine core, thereby preventing material decomposition while the device is operating. In addition, the p-biphenyl group used in the compound of this disclosure has high electron mobility, so it helps electrons move in balance with the transport rate of holes, which have higher mobility than electrons, thereby improving the electrical stability of the device. Accordingly, the compound of this disclosure may improve the thermal stability and electrical stability of the electron transport compound by introducing a p-biphenyl group on the triazine core, thereby allowing for stable operation of the device and improving the lifetime of the device.

Accordingly, the first electron transport layer 150 is formed of an electron transport compound represented by the following Chemical Formula 1:

[Chemical Formula 1]

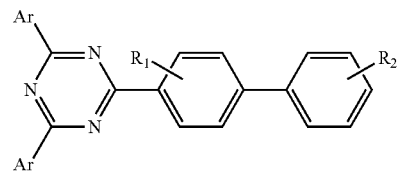

wherein Ar includes a substituted or unsubstituted aryl group of 6 to 30 carbon atoms, $R_1$ and $R_2$ include independently one among a substituted or unsubstituted alkyl group of 1 to 6 carbon atoms, a substituted or unsubstituted cycloalkyl group of 1 to 6 carbon atoms, and a substituted or unsubstituted aryl group of 6 to 30 carbon atoms. Substituents may be one among a deuterium, —F, a trifluoromethyl group, a cyano group, a nitro group, a trialkylsilyl group, a triarylsilyl group, an alkyl group of 1 to 6 carbon atoms, a cycloalkyl group of 1 to 6 carbon atoms, an aryl group of 6 to 30 carbon atoms, and a heteroaryl group of 5 to 30 carbon atoms.

Here, Ar may be one among the following compounds:

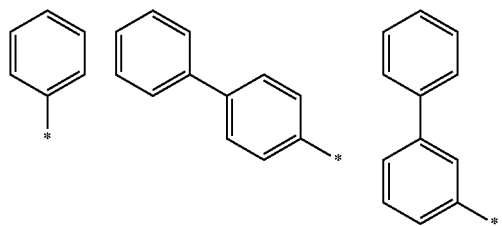

-continued
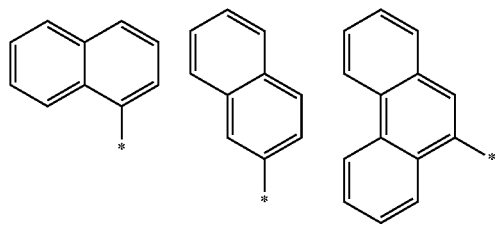
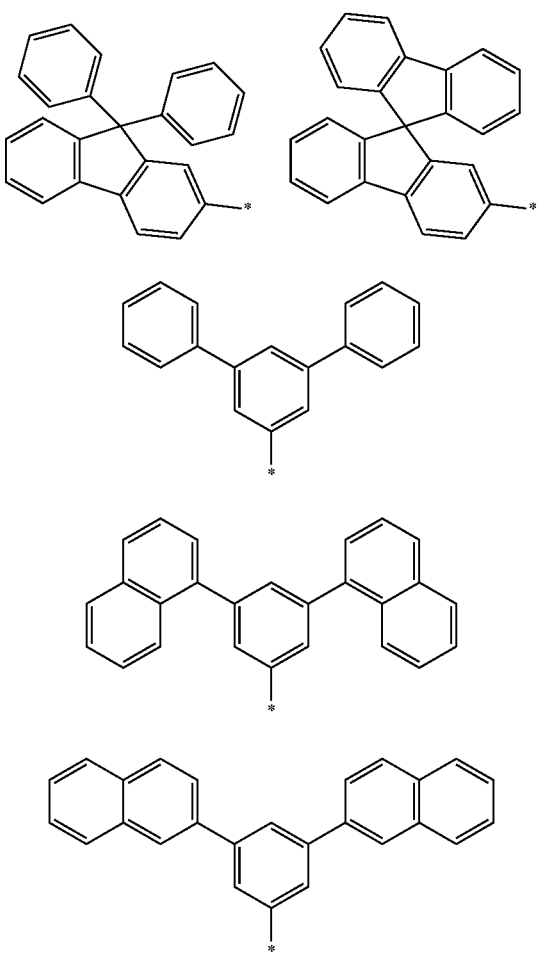
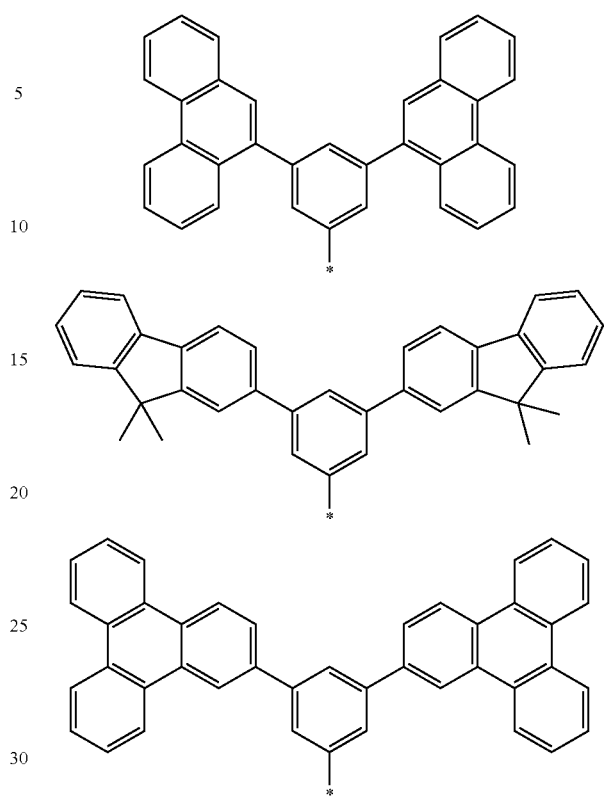
Here, $R_1$ and $R_2$ may be independently one among the following structures:
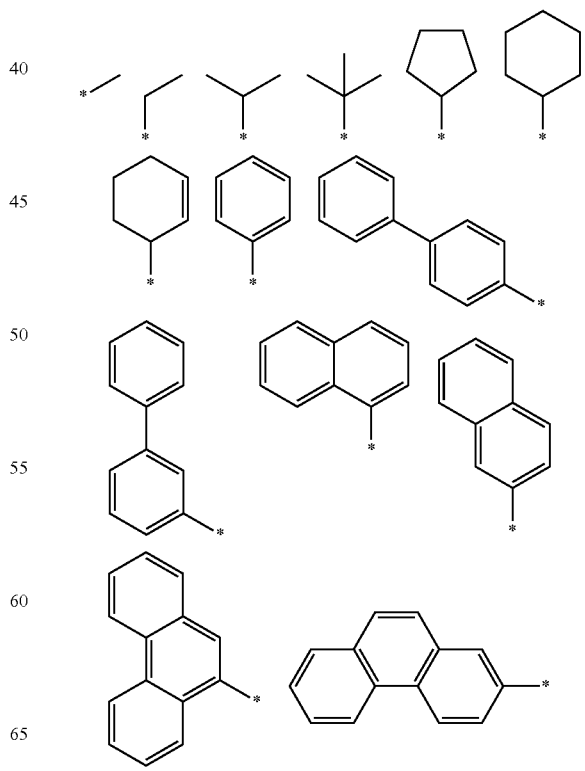

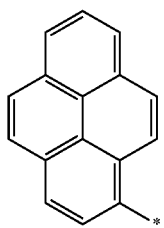
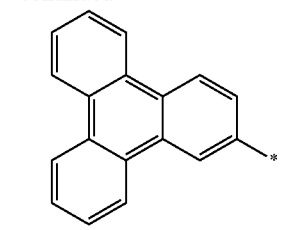
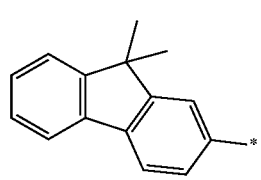
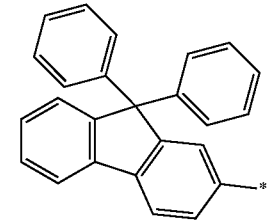
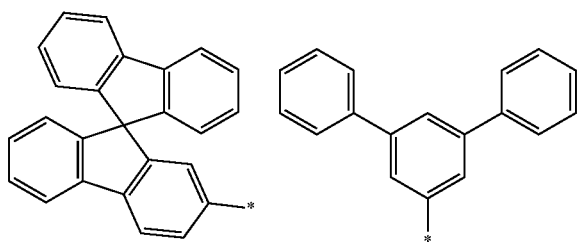
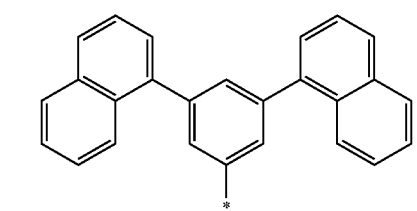
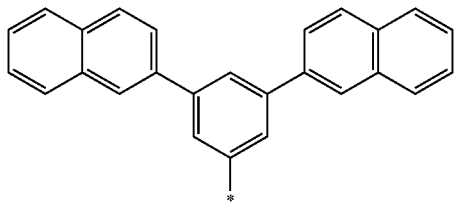
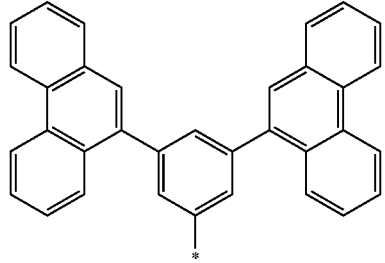
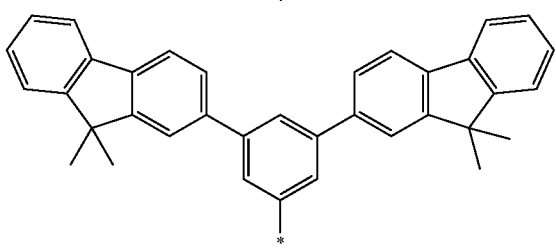

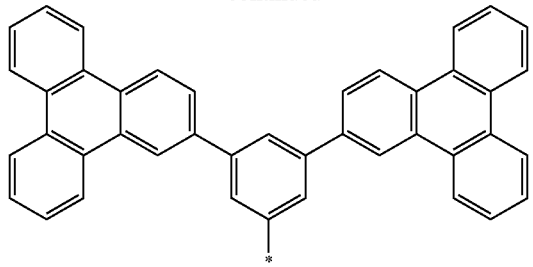

The compound represented by Chemical Formula 1 may be one among the following compounds:

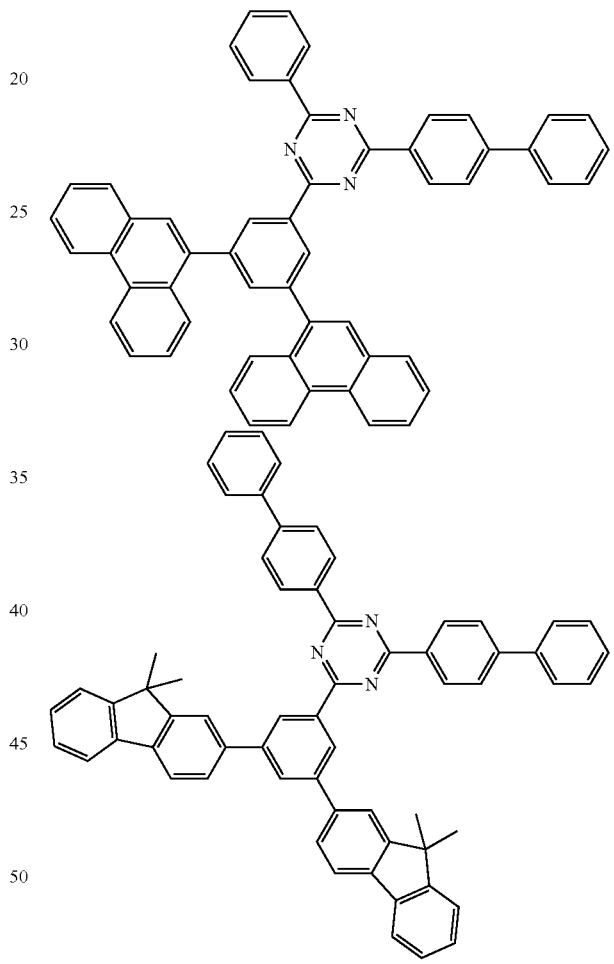

The first electron transport layer 150 may have a 1 to 150 nm thickness. If the first electron transport layer 150 has a 1 nm thickness or greater, a degradation of the electron transport properties may be prevented, or if the first electron transport layer 150 has a 150 nm thickness or less, an increase in the thickness of the first electron transport layer 150 may be prevented, and a rise in operating voltage may be therefore prevented.

The second light emitting part ST2 comprising a second hole transport layer 180, a second light emitting layer 190, a second electron transport layer 200, and an electron injection layer 210 is on the first light emitting part ST1.

The second light emitting layer 190 may emit light of red, green, or blue. In this exemplary embodiment, the second light emitting layer 190 may be a light emitting layer that emits yellow-green light. The second light emitting layer 190 may have a single layer structure of a yellow-green light emitting layer or green light emitting layer, or a multilayer structure formed of a yellow-green light emitting layer and a green light emitting layer. The second light emitting layer 190 comprises a yellow-green light emitting layer, a green light emitting layer, or a multilayer structure formed of a yellow-green light emitting layer and a green light emitting layer, a yellow light emitting layer and a red light emitting layer, a green light emitting layer and a red light emitting layer, or a yellow-green light emitting layer and a red light emitting layer. This exemplary embodiment will be described by taking as an example a single layer structure of a second light emitting layer that emits yellow-green light. The second light emitting layer 190 may include, but is not limited to, at least one host among CBP 4,4'-bis(carbazol-9-yl)biphenyl) and BAlq (Bis(2-methyl-8-quinolinolato)-4-(phenylphenolato)aluminum) and a phosphorescent yellow-green dopant that emits yellow-green light. But it is not limited thereto.

The second light emitting part ST2 comprises the second hole transport layer 180 on the first light emitting part ST1, and comprises the second electron transport layer 200 and electron injection layer 210 on the second light emitting layer 190. The second hole transport layer 180 and the second electron transport layer 200 may have the same composition as the hole injection layer 120, the first hole transport layer 130, and the first electron transport layer 150 of the above-described first light emitting part ST1, respectively, or have different compositions from their compositions. The electron injection layer 210 may not be included in the elements of the second light emitting part ST2, depending on the structure or characteristics of the device.

The second electron transport layer 200, if formed differently from the first electron transport layer 150, may be formed of, but is not limited to, Alq₃ (tris(8-hydroxyquinolinato)aluminum), PBD (2-4-biphenyl)-5-(4-tert-butylphenyl)-1,3,4-oxadiazole), TAZ (3-(4-biphenyl)-4-pheynyl-5-tert-butylphenyl-1,2,4-triazole), or BAlq (Bis(2-methyl-8-quinolinolato)-4-(phenylphenolato)aluminum). The second electron transport layer 200 may be 1 to 50 nm thickness. If the second electron transport layer 200 is 1 nm thickness or greater, a degradation of the electron transport properties may be prevented, or if the second electron transport layer 200 is 50 nm thickness or less, an increase in the thickness of the second electron transport layer 200 may be prevented, and a rise in operating voltage may be therefore prevented.

A charge generation layer (CGL) 160 is between the first light emitting part ST1 and the second light emitting part ST2. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or separates the electron and holes, and injects the charge, i.e., electrons and holes to the light emitting layer. That is, the N-type charge generation layer 160N transfers electrons to the first electron transport layer 150 and supplies the electrons to the first light emitting layer 140 adjacent to the anode 110, and the P-type charge generation layer 160P transfers holes to the second hole transport layer 180 and supplies the holes to the second light emitting layer 190 of the second light emitting part ST2. As such, the organic light emitting display device with a plurality of light emitting layers can further increase its light emission efficiency and lower its operating voltage. Accordingly, the charge generation layer 160 has a major effect on the organic light emitting display device's light emission efficiency, operating voltage, or lifetime.

Thus, the present inventors conducted several tests or experiments to improve the electron injection properties of the N-type charge generation layer. Through a number of tests or experiments which were performed on materials that do not affect the efficiency, etc. of the organic light emitting display device and that cause no rise in operating voltage, a phenanthroline compound was chosen as the N-type charge generation layer. A compound of this disclosure makes the energy level of the N-type charge generation layer match the energy level of an electron transport layer formed of a p-biphenyltriazine compound by introducing a naphthyl group on a phenanthroline ring, thereby making electron movement easy. If a phenyl group, etc., which has a shorter conjugation length than the naphthyl group, is used, the LUMO of the N-type charge generation layer becomes shallower than the LUMO of the electron transport layer and their energy levels are reversed in terms of sequential movement of electrons. If an anthracene group, etc., which has a longer conjugation length than the naphthyl group, is used, the LUMO of the N-type charge generation layer becomes deeper than the LUMO of the electron transport layer and the energy barrier to the movement of electrons from the N-type charge generation layer to the electron transport layer becomes higher. That is, an energy level that matches the p-biphenyltriazine compound may be achieved by introducing a naphthyl group on the phenanthroline ring. Accordingly, the energy level of the N-type charge generation layer matches the energy level of the electron transport layer, thereby facilitating the movement of electrons from the N-type charge generation layer to the electron transport layer. Moreover, the charge generation compound facilitates the transport of electrons by the presence of an aromatic ring in the molecule. In addition, the mobility of electrons within the N-type charge generation layer may be improved by introducing an aryl group with at least three or more rings to the naphthyl group used on the phenanthroline core.

Accordingly, the charge generation compound of this disclosure may achieve the energy level enough for electrons to move smoothly to the electron transport layer by introducing a naphthyl group on the phenanthroline core, thereby allowing for stable operation of the device and improving the lifetime of the device.

Accordingly, the N-type charge generation layer 160N is formed of a charge generation compound represented by the following Chemical Formula 2:

[Chemical Formula 2]

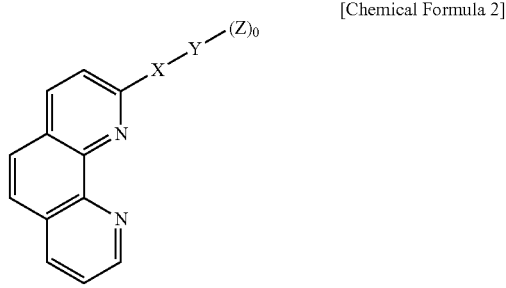

wherein X includes a substituted or unsubstituted naphthyl group, Y includes a substituted or unsubstituted aryl group with at least three or more ring structures, Z includes a phenyl group that is substituted or unsubstituted by an alkyl group, an aryl group, or a heteroaryl group, and o is 0 or 1. Substituents may be one among a methyl group, an ethyl group, a n-propyl group, an isopropyl group, a n-butyl group, a sec-butyl group, an isobutyl group, a tert-butyl group, a phenyl group, a naphthyl group, an indenyl group, a fluorenyl group, a pyridinyl group, a pyrazinyl group, a pyrimidinyl group, a quinolinyl group, an isoquinolinyl group, a pyrrolyl group, a furanyl group, and a thiophenyl group.

Here, X may be one among the following compounds:

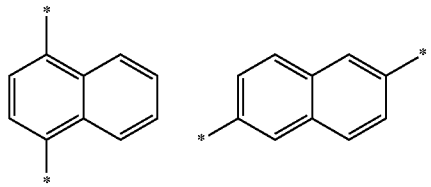

Further, Y may be one among the following compounds:

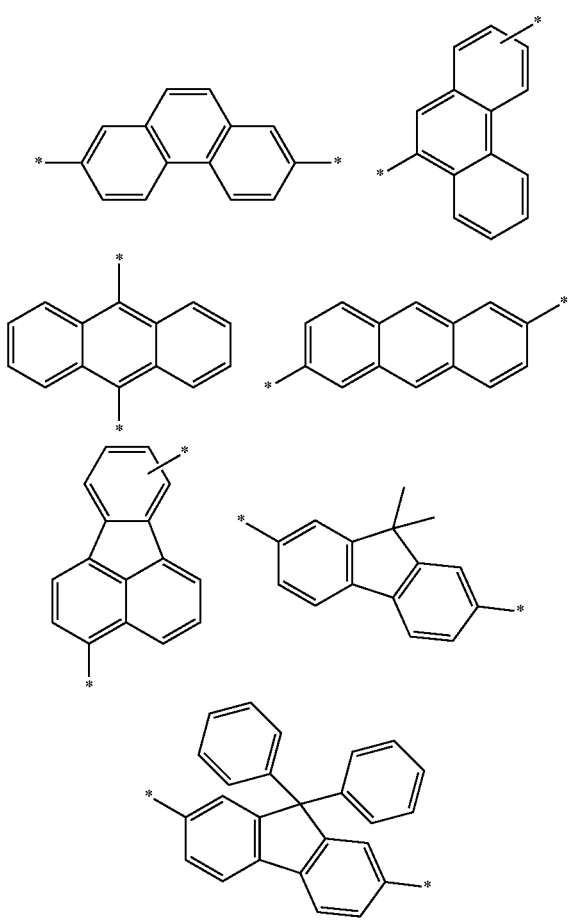

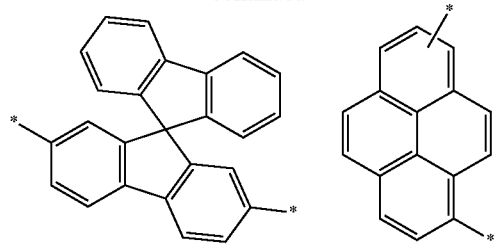

The charge generation compound represented by Chemical Formula 2 may be one among the following compounds:

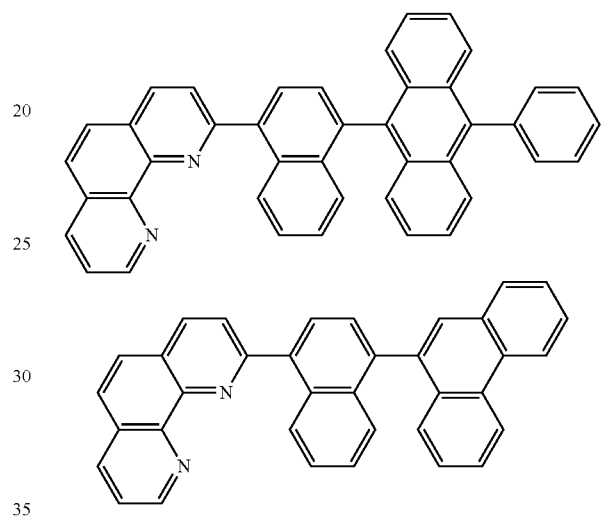

The N-type charge generation layer 160N of this disclosure may be doped with a metal or N-type dopant. The metal may be one material among Li, Na, K, Rb, Cs, Mg, Ca, Sr, Ba, La, Ce, Sm, Eu, Tb, Dy, and Yb. For example, the N-type dopant may be an alkali metal, an alkali metal compound, an alkali earth metal, or an alkali earth metal compound. Specifically, the N-type dopant may be one among Li, Be, Cs, K, Rb, Mg, Na, Ca, Sr, Eu, Fr, Ba, Ra, and Yb. The percentage of the dopant to be mixed is between 0.1% and 10% by volume relative to 100% for the host. The dopant may have a work function of 2.5 eV or greater.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be one material among $F_4$-TCNQ (2,3,5,6-tetrafluoro-7,7,8,8-tetracyanoquinodimethane), iodine, $FeCl_3$, $FeF_3$, and $SbCL_5$. The host may be one material among NPB (N,N'-bis(naphthalene-1-yl)-N,N'-bis(phenyl)-benzidine), TPD (N,N'-bis-(3-methylphenyl)-N,N'-bis(phenyl)-benzidine), and TNB (N,N,N'N'-tetranaphthalenyl-benzidine).

The cathode 220 is provided on the second light emitting part ST2 to constitute the organic light emitting display device according to the first exemplary embodiment of the present disclosure. The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

Organic light emitting displays using the organic light emitting display device according to the first exemplary embodiment of the present disclosure may include top emission displays, bottom emission displays, dual emission displays, and vehicle lighting. The vehicle lighting may include, but are not necessarily limited to, headlights, high beams, taillights, brake lights, and back-up lights. Moreover, organic light emitting displays using the organic light emitting display device according to the first exemplary embodiment of the present disclosure may be applied to mobile devices, monitors, TVs, etc. In addition, organic light emitting displays using the organic light emitting display device according to the first exemplary embodiment of the present disclosure may be applied to displays in which the first and second light emitting layers emit light of the same color.

Although the first exemplary embodiment of the present disclosure has been described with an example in which the first electron transport layer 150 and the N-type charge generation layer 160N each comprise a compound of this disclosure, the present disclosure is not limited thereto, and the second electron transport layer 200, too, may be formed of a compound of this disclosure, like the first electron transport layer 150.

As stated above, an electron transport compound included in an electron transport layer of this disclosure makes electron transport from the electron transport layer to the light emitting layer easy by comprising a functional group with high electron mobility. Moreover, the electron transport compound may increase the thermal stability of the material by introducing a p-biphenyl group on a triazine core, thereby preventing material decomposition while the device is operating.

In addition, the p-biphenyl group used in the electron transport compound of this disclosure has high electron mobility, so it helps electrons move in balance with the transport rate of holes, which have higher mobility than electrons, thereby improving the electrical stability of the device. Accordingly, the electron transport compound of this disclosure may improve the thermal stability and electrical stability of the compound by introducing a p-biphenyl group on the triazine core, thereby allowing for stable operation of the device and improving the lifetime of the device.

Furthermore, a charge generation compound included in the N-type charge generation layer of this disclosure makes the energy level of the N-type charge generation layer match the energy level of an electron transport layer formed of a p-biphenyltriazine compound by introducing a naphthyl group on a phenanthroline ring, thereby making electron movement easy. If a phenyl group, etc., which has a shorter conjugation length than the naphthyl group, is used, the LUMO of the N-type charge generation layer becomes shallower than the LUMO of the electron transport layer and their energy levels are reversed in terms of sequential movement of electrons. If an anthracene group, etc., which has a longer conjugation length than the naphthyl group, is used, the LUMO of the N-type charge generation layer becomes deeper than the LUMO of the electron transport layer and the energy barrier to the movement of electrons from the N-type charge generation layer to the electron transport layer becomes higher. That is, an energy level that matches the p-biphenyltriazine compound may be achieved by introducing a naphthyl group on the phenanthroline ring. Accordingly, the energy level of the N-type charge generation layer matches the energy level of the electron transport layer, thereby facilitating the movement of electrons from the N-type charge generation layer to the electron transport layer. Moreover, the charge generation compound facilitates the transport of electrons by the presence of an aromatic ring in the molecule. In addition, the mobility of electrons within the N-type charge generation layer may be improved by introducing an aryl group with at least three or more rings to the naphthyl group used on the phenanthroline core.

Besides, the organic light emitting display device of this disclosure comprises an electron transport layer comprising a triazine compound and an N-type charge generation layer comprising a phenanthroline compound, thereby improving the interface characteristics of the electron transport layer and N-type charge generation layer and facilitating the movement of electrons from the N-type charge generation layer to the electron transport layer. This allows for stable operation of the device, thereby reducing the operating voltage and improving the lifetime.

Figure 2:
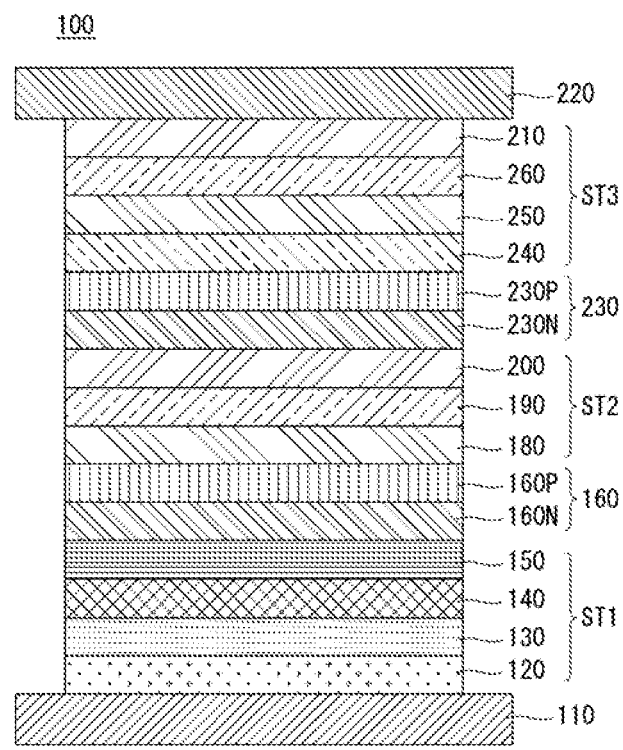
FIG. 2 is a cross-sectional view showing an organic light emitting display device according to a second exemplary embodiment of the present disclosure.

FIG. 2 is a view showing an organic light emitting display device according to a second exemplary embodiment of the present disclosure. The same elements as the first exemplary embodiment are denoted by the same reference numerals, so descriptions of these elements will be omitted below.

Referring to FIG. 2, an organic light emitting display device 100 of this disclosure comprises a plurality of light emitting parts ST1, ST2, and ST3 between an anode 110 and a cathode 220, and first and second charge generation layers 160 and 230 between the light emitting parts ST1, ST2, and ST3. Although this exemplary embodiment has been illustrated and described with an example where three light emitting parts are between the anode 110 and the cathode 220, the present disclosure is not limited to this example and four or more light emitting parts may be between the anode 110 and the cathode 220.

Among the light emitting parts, the first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, a blue light emitting layer and a yellow-green light emitting layer, or a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, the first hole transport layer 130, the first light emitting layer 140, and the first electron transport layer 150 is formed on the anode 110. The hole injection layer 120 may not be included in the elements of the first light emitting part ST1, depending on the structure or characteristics of the device.

Like the above-described first exemplary embodiment, the first electron transport layer 150 of this disclosure may be formed of an electron transport compound. The compound of this disclosure makes electron transport from the electron transport layer to the light emitting layer easy by comprising a functional group with high electron mobility. Moreover, the compound of this disclosure may increase the thermal stability of the material by introducing a p-biphenyl group on a triazine core, thereby preventing material decomposition while the device is operating. In addition, the p-biphenyl group used in the compound of this disclosure has high electron mobility, so it helps electrons move in balance with the transport rate of holes, which have higher mobility than electrons, thereby improving the electrical stability of the device. Accordingly, the compound of this disclosure may improve the thermal stability and electrical stability of the compound by introducing a p-biphenyl group on the triazine core, thereby allowing for stable operation of the device and improving the lifetime of the device.

The second light emitting part ST2 comprising a second light emitting layer 190 is on the first light emitting part ST1. The second light emitting layer 190 may emit light of red, green, or blue: for example, it may be a yellow-green light emitting layer in this exemplary embodiment. The second light emitting layer 190 may comprise a yellow-green light emitting layer, a green light emitting layer, or a multilayer structure formed of a yellow-green light emitting layer and a green light emitting layer, a yellow light emitting layer and a red light emitting layer, a green light emitting layer and a red light emitting layer, or a yellow-green light emitting layer and a red light emitting layer. The second light emitting part ST2 further comprises a second hole transport layer 180 on the first light emitting part ST1, and a second electron transport layer 200 on the second light emitting layer 190. Accordingly, the second light emitting part ST2 comprising the second hole transport layer 180, second light emitting layer 190, and second electron transport layer 200 is formed on the first light emitting part ST1. The second electron transport layer 200 of this disclosure may be formed of an electron transport compound, like the above-described first electron transport layer 150. The electron transport compound has been described above with respect to the first electron transport layer 150, so a description thereof will be omitted.

The first charge generation layer 160 is between the first light emitting part ST1 and the second light emitting part ST2. The first charge generation layer 160 is a PN-junction charge generation layer, formed by joining an N-type charge generation layer 160N and a P-type charge generation layer 160P, which generate a charge, or inject the charge, i.e., electrons and holes, separately into the light emitting layers, respectively.

Like the above-described first exemplary embodiment, the N-type charge generation layer 160N of this disclosure is formed of a charge generation compound.

A charge generation compound of this disclosure makes the energy level of the N-type charge generation layer match the energy level of an electron transport layer formed of a p-biphenyltriazine compound by introducing a naphthyl group on a phenanthroline ring, thereby making electron movement easy. If a phenyl group, etc., which has a shorter conjugation length than the naphthyl group, is used, the LUMO of the N-type charge generation layer becomes shallower than the LUMO of the electron transport layer and their energy levels are reversed in terms of sequential movement of electrons. If an anthracene group, etc., which has a longer conjugation length than the naphthyl group, is used, the LUMO of the N-type charge generation layer becomes deeper than the LUMO of the electron transport layer and the energy barrier to the movement of electrons from the N-type charge generation layer to the electron transport layer becomes higher. That is, an energy level that matches the p-biphenyltriazine compound may be achieved by introducing a naphthyl group on the phenanthroline ring. Accordingly, the energy level of the N-type charge generation layer matches the energy level of the electron transport layer, thereby facilitating the movement of electrons from the N-type charge generation layer to the electron transport layer. Moreover, the charge generation compound facilitates the transport of electrons by the presence of an aromatic ring in the molecule. In addition, the mobility of electrons within the N-type charge generation layer may be improved by introducing an aryl group with at least three or more rings to the naphthyl group used on the phenanthroline core. Accordingly, the charge generation compound of this disclosure may achieve the energy level enough for electrons to move smoothly to the electron transport layer by introducing a naphthyl group on the phenanthroline core, thereby allowing for stable operation of the device and improving the lifetime of the device.

The third light emitting part ST3 comprising a third light emitting layer 250 is on the second light emitting part ST2. The third light emitting layer 250 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the third light emitting layer 250 may be formed of a blue light emitting layer and a red light emitting layer, a blue light emitting layer and a yellow-green light emitting layer, or a blue light emitting layer and a green light emitting layer.

The third light emitting part ST3 further comprises a third hole transport layer 240 on the second light emitting part ST2, and a third electron transport layer 260 and an electron injection layer 210 that are on the third light emitting layer 250. The third electron transport layer 260 has the same composition as the aforementioned first electron transport layer 150, so its description will be omitted. Accordingly, the third light emitting part ST3 comprising the third hole transport layer 240, the third light emitting layer 250, the third electron transport layer 260, and the electron injection layer 210 is formed on the second light emitting part ST2. The electron injection layer 210 may not be included in the elements of the third light emitting part ST3, depending on the structure or characteristics of the organic light emitting display device.

The second charge generation layer 230 is between the second light emitting part ST2 and the third light emitting part ST3. The second charge generation layer 230 is a PN-junction charge generation layer, formed by joining an N-type charge generation layer 230N and a P-type charge generation layer 230P, which generate a charge, or inject the charge, i.e., electrons and holes, separately into the light emitting layers, respectively. The N-type charge generation layer 230N of the second charge generation layer 230 of this disclosure may be formed of a charge generation compound, like the above-described N-type charge generation layer 160N of the first charge generation layer 160. The charge generation compound has been described above with respect to the N-type charge generation layer 160N of the first charge generation layer 160, so a description thereof will be omitted. The cathode 220 is provided on the third light emitting part ST3 to constitute the organic light emitting display device according to the second exemplary embodiment of the present disclosure.

Organic light emitting displays using the organic light emitting display device according to the second exemplary embodiment of the present disclosure may include top emission displays, bottom emission displays, dual emission displays, and vehicle lighting. The vehicle lighting may include, but are not necessarily limited to, headlights, high beams, taillights, brake lights, and back-up lights. Moreover, organic light emitting displays using the organic light emitting display device according to the second exemplary embodiment of the present disclosure may be applied to mobile devices, monitors, TVs, etc. In addition, organic light emitting displays using the organic light emitting display device according to the second exemplary embodiment of the present disclosure may be applied to displays in which at least two of the first, second, and third light emitting layers emit light of the same color.

Although the second exemplary embodiment of the present disclosure has been described with an example in which the first electron transport layer 150, the second electron transport layer 200, and the third electron transport layer 260 each comprise an electron transport compound of this disclosure, the present disclosure is not limited thereto, and at least one among the first electron transport layer 150, the second electron transport layer 200, and the third electron transport layer 260 may be formed of an electron transport compound of this disclosure. Also, although the second exemplary embodiment of the present disclosure has been described with an example in which the N-type charge generation layer 160N of the first charge generation layer 160 and the N-type charge generation layer 230N of the second charge generation layer 230 each comprise a charge generation compound of this disclosure, the present disclosure is not limited thereto, and at least one between the N-type charge generation layer 160N of the first charge generation layer 160 and the N-type charge generation layer 230N of the second charge generation layer 230 may be formed of a charge generation compound of this disclosure.

Moreover, an electron transport layer formed of an electron transport compound of this disclosure and an N-type charge generation layer formed of a charge generation compound of this disclosure adjoin each other. For example, if the first electron transport layer 150 is formed of a triazine compound, the N-type charge generation layer 160N of the first charge generation layer 160 adjoining the first electron transport layer 150 may be formed of a phenanthroline compound. Since the energy level of the phenanthroline compound of this disclosure may be enough to make electrons smoothly move to the triazine compound, the electron transport layer formed of the triazine compound of this disclosure and the N-type charge generation layer formed of the phenanthroline compound of this disclosure may adjoin each other. However, the present disclosure is not limited thereto, and the electron transport layer formed of the triazine compound of this disclosure and the N-type charge generation layer formed of the phenanthroline compound of this disclosure may not adjoin each other.

As stated above, an electron transport compound included in an electron transport layer of this disclosure makes electron transport from the electron transport layer to the light emitting layer easy by comprising a functional group with high electron mobility. Moreover, the electron transport compound may increase the thermal stability of the material by introducing a p-biphenyl group on a triazine core, thereby preventing material decomposition while the device is operating.

In addition, the p-biphenyl group used in the electron transport compound of this disclosure has high electron mobility, so it helps electrons move in balance with the transport rate of holes, which have higher mobility than electrons, thereby improving the electrical stability of the device. Accordingly, the electron transport compound of this disclosure may improve the thermal stability and electrical stability of the compound by introducing a p-biphenyl group on the triazine core, thereby allowing for stable operation of the device and improving the lifetime of the device.

Furthermore, a charge generation compound included in the N-type charge generation layer of this disclosure makes the energy level of the N-type charge generation layer match the energy level of an electron transport layer formed of a p-biphenyltriazine compound by introducing a naphthyl group on a phenanthroline ring, thereby making electron movement easy. Moreover, the charge generation compound facilitates the transport of electrons by the presence of an aromatic ring in the molecule. In addition, the mobility of electrons within the N-type charge generation layer may be improved by introducing an aryl group with at least three or more rings to the naphthyl group used on the phenanthroline core.

Besides, the organic light emitting display device of this disclosure comprises an electron transport layer comprising a triazine compound and an N-type charge generation layer comprising a phenanthroline compound, thereby improving the interface characteristics of the electron transport layer and N-type charge generation layer and facilitating the movement of electrons from the N-type charge generation layer to the electron transport layer. This allows for stable operation of the device, thereby reducing the operating voltage and improving the lifetime.

Hereinafter, synthesis examples of electron transport compounds and charge generation compounds of the present disclosure will be described in detail. However, the following examples are only for illustration, and the present disclosure is not limited thereto.

1) Synthesis of Compound N-CGL_A

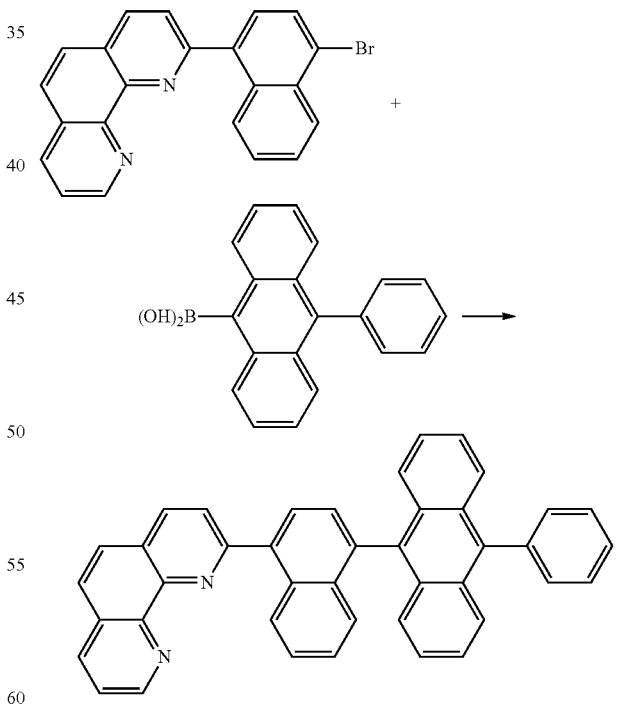

5.0 g of (2-(1-bromonaphthalen-4-yl)-1,10-phenanthroline (13.0 mmol), 4.6 g of 9-phenylanthracen-10-yl-10-boronic acid (15.6 mmol), 0.30 g of tetrakistriphenylphosphine palladium (0) (Pd(PPh3)4) (0.26 mmol), 40 mL of 2M potassium carbonate ($K_2CO_3$) solution, and 120 mL of tetrahydrofuran (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound N-CGL_A.

2) Synthesis of Compound N-CGL_B

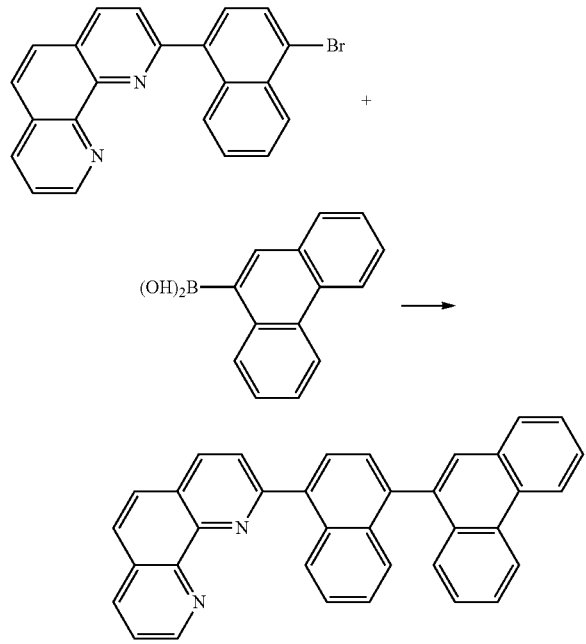

5.0 g of (2-(1-bromonaphthalen-4-yl)-1,10-phenanthroline (13.0 mmol), 3.5 g of phenanthren-9-yl-9-boronic acid (15.6 mmol), 0.30 g of tetrakistriphenylphosphine palladium (0) (Pd(PPh3)4) (0.26 mmol), 40 mL of 2M potassium carbonate (K$_2$CO$_3$) solution, and 120 mL of tetrahydrofuran (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound N-CGL_B.

3) Synthesis of Compound ETL_A

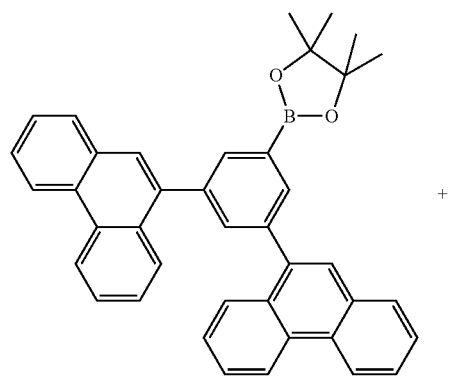

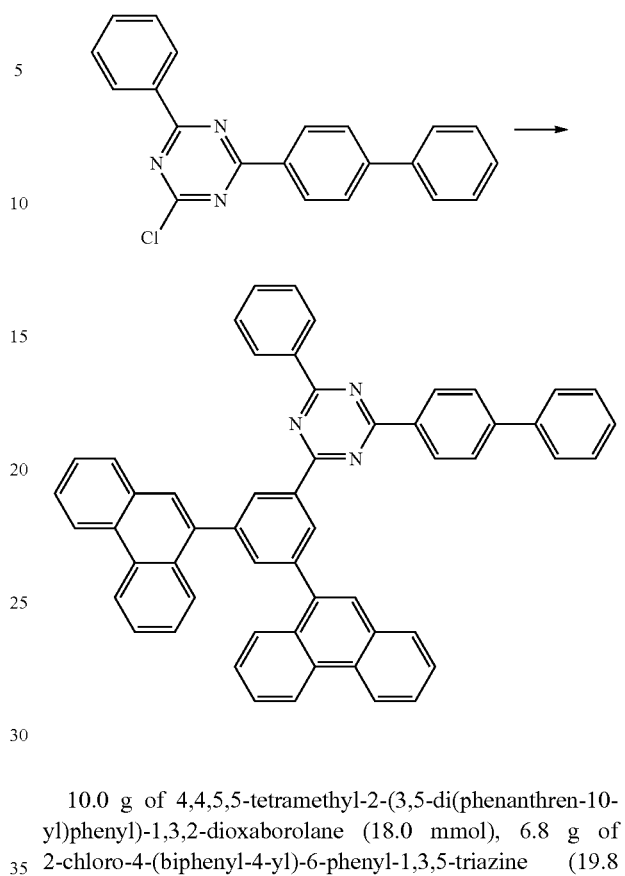

10.0 g of 4,4,5,5-tetramethyl-2-(3,5-di(phenanthren-10-yl)phenyl)-1,3,2-dioxaborolane (18.0 mmol), 6.8 g of 2-chloro-4-(biphenyl-4-yl)-6-phenyl-1,3,5-triazine (19.8 mmol), 0.42 g of tetrakistriphenylphosphine palladium (0) (Pd(PPh3)4) (0.36 mmol), 50 mL of 2M potassium carbonate (K$_2$CO$_3$) solution, and 150 mL of tetrahydrofuran (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound ETL_A.

4) Synthesis of Compound ETL_B

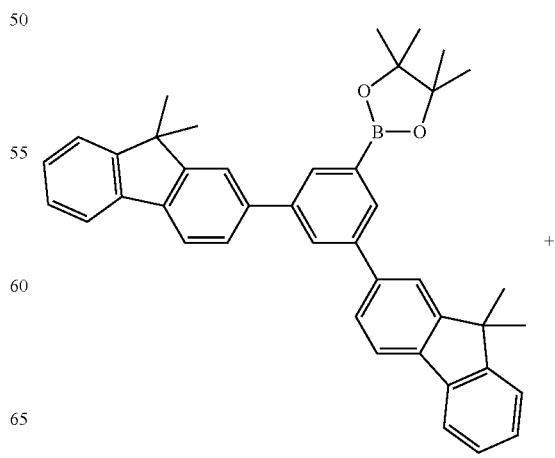

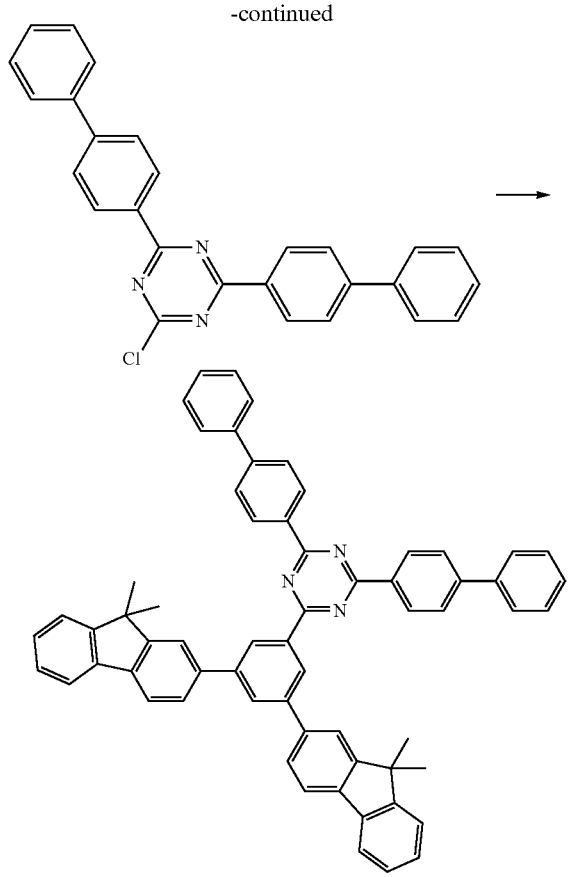

10.0 g of 2-(3,5-bis(9,9-dimethyl-9H-fluoren-2-yl)phenyl)-4,4,5,5-tetramethyl-1,3,2-dioxaborolane (17.0 mmol), 7.8 g of 2,4-bis([1,1-biphenyl]-4-yl)-6-chloro-1,3,5-triazine (18.7 mmol), 0.39 g of tetrakistriphenylphosphine palladium (0) (Pd(PPh3)4) (0.34 mmol), 45 mL of 2M potassium carbonate (K$_2$CO$_3$) solution, and 150 mL of tetrahydrofuran (THF) were put into a 250-mL round-bottom flask under an argon atmosphere, and then refluxed and stirred. Thin-layer chromatography (TLC) was applied to monitor the completion of the reaction, and then an organic layer was isolated from the reaction solution and vacuum-distilled, followed by column chromatography, to obtain Compound ETL_B.

Hereinafter, embodiments for the manufacture of an organic light emitting display device according to the present disclosure will be disclosed. However, the following materials for the electron transport layer and N-type charge generation layer do not limit the scope of the present disclosure.

COMPARATIVE EXAMPLE 1

An organic light emitting display device was manufactured by forming, on a substrate, a first light emitting part comprising a first blue light emitting layer and a first electron transport layer, a charge generation layer, a second light emitting part comprising a second blue light emitting layer and a second electron transport layer, and a cathode. Here, the first electron transport layer was formed of the following Compound ETL_1, and the N-type charge generation layer of the charge generation layer was formed of the following Compound N-CGL_A.

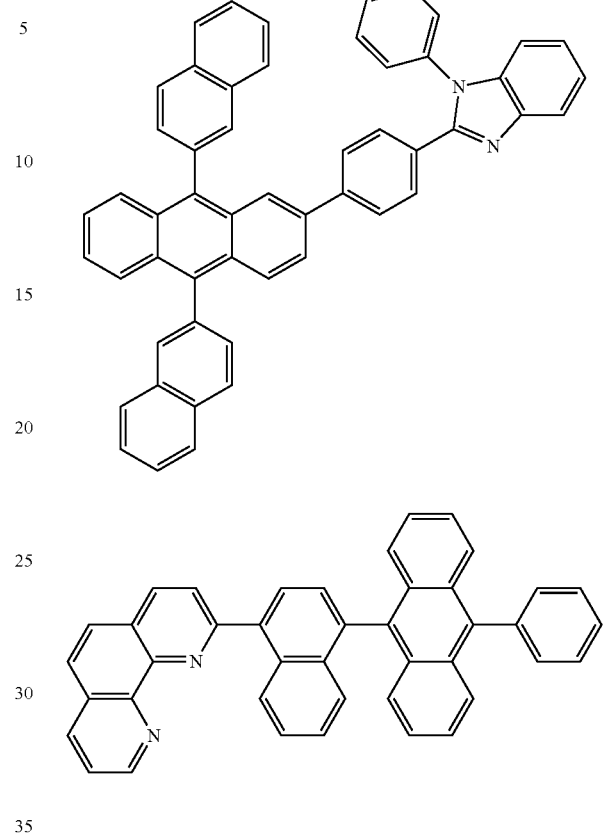

<Embodiment 1>

It has the same elements as the above-described Comparative Example 1, and the first electron transport layer was formed of the following Compound ETL_2.

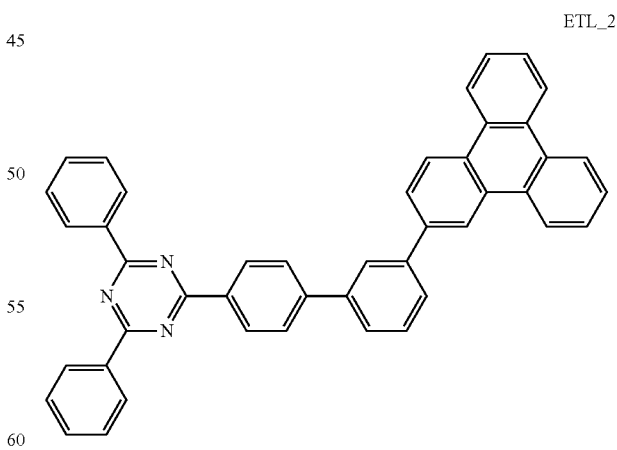

<Embodiment 2>

It has the same elements as the above-described Comparative Example 1, and the N-type charge generation layer was formed of the following Compound CGL_B.

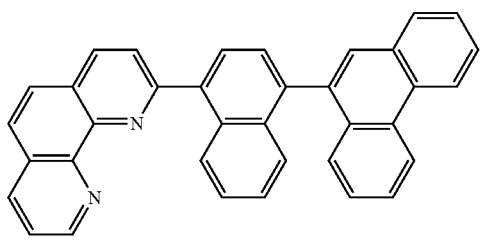 [SMILES: c1ccc2c(c1)cc(-c1ccc(-c3ccc4ccc5cccnc5c4n3)c3ccccc13)c1ccccc12]

The materials for the electron transport layer and N-type charge generation layer in the above Comparative Example 1 and Embodiments 1 and 2 do not limit the scope of the present disclosure.

The operating voltage, quantum efficiency, and lifetime of the devices manufactured according to the above-described Comparative Example 1 and Embodiments 1 and 2 were measured and shown in the following Table 1. (The measurements taken in Embodiments 1 and 2 were expressed as a percentage relative to those taken in Comparative Example 1 corresponding to 100%, and the devices manufactured according to Comparative Example 1 and Embodiments 1 and 2 were driven at an operating current density of 10 mA/cm$^2$).

Figure 3:
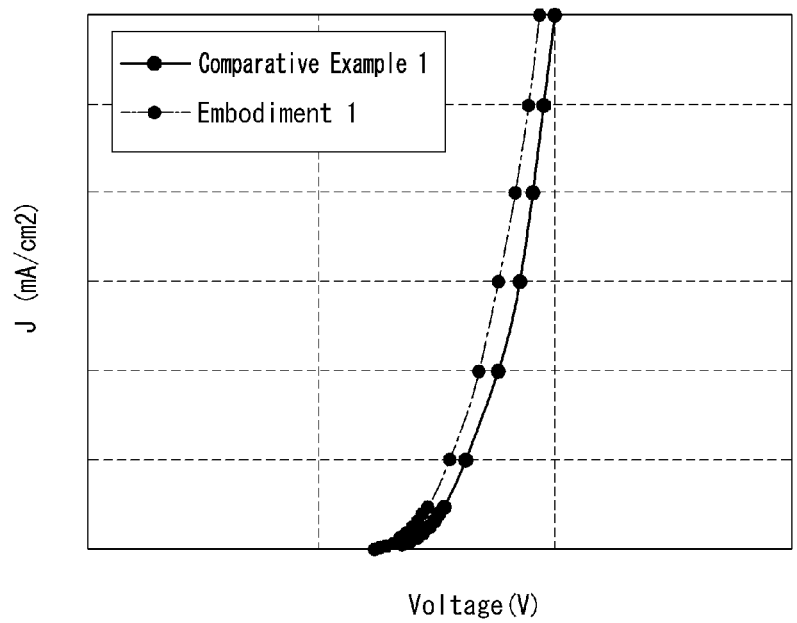
FIG. 3 is a graph of the current density vs. voltage of organic light emitting display devices according to Comparative Example 1 and Embodiment 1 of the present disclosure.
Figure 4:
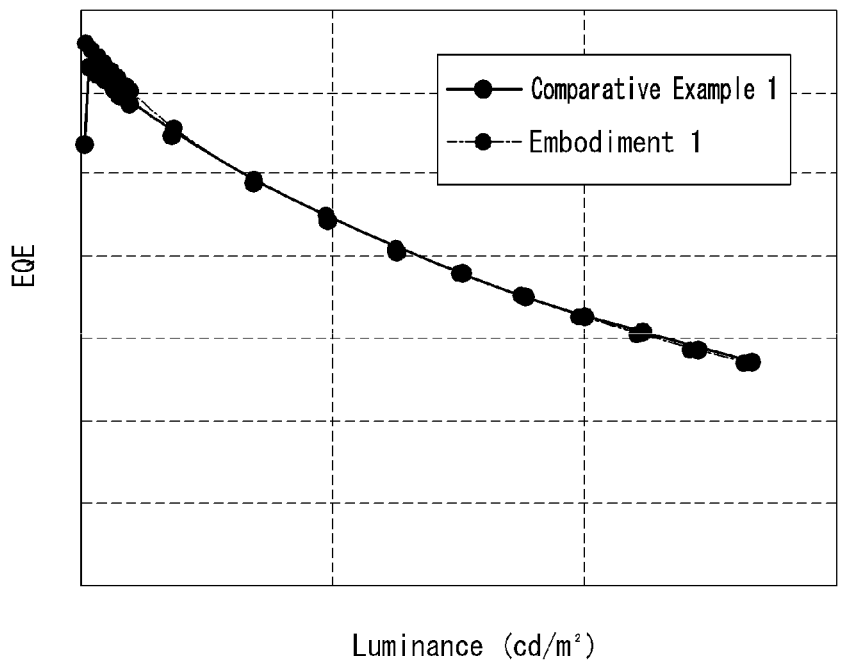
FIG. 4 is a graph of the quantum efficiency vs. luminance of organic light emitting display devices according to Comparative Example 1 and Embodiment 1 of the present disclosure.

The current density vs. voltage of the organic light emitting display devices manufactured according to Comparative Example 1 and Embodiment 1 was measured and shown in FIG. 3, and the quantum efficiency vs. luminance was measured and shown in FIG. 4. Also, the current density vs. voltage of the organic light emitting display devices manufactured according to Comparative Example 1 and Embodiment 2 was measured and shown in FIG. 5, and the quantum efficiency vs. luminance was measured and shown in FIG. 6.

TABLE 1

|  | Operating Voltage | Quantum efficiency | Lifetime |
| --- | --- | --- | --- |
| Comparative Example 1 | 100% | 100% | 100% |
| Embodiment 1 | 94% | 102% | 128% |
| Embodiment 2 | 94% | 100% | 155% |

Referring to Table 1 and FIGS. 3 and 4, Embodiment 1 using a triazine compound as the electron transport layer and a phenanthroline compound as the N-type charge generation layer showed a 6% decrease in operating voltage and a 28% increase in lifetime, compared to Comparative Example 1 using an anthracene compound as the electron transport layer and a phenanthroline compound as the N-type charge generation layer.

FIG. 3 shows the current density vs. voltage, from which it can be seen that Embodiment 1 had a reduction in operating voltage, compared to Comparative Example 1. FIG. 4 shows the quantum efficiency vs. luminance, from which it can be seen that Embodiment 1 had an improvement in quantum efficiency compared to Comparative Example 1. In view of this, it can be seen that the reduction in operating voltage and the improvement in lifetime were achieved by comprising an N-type charge generation layer of a phenanthroline compound, along with an electron transport layer of a triazine compound.

Figure 5:
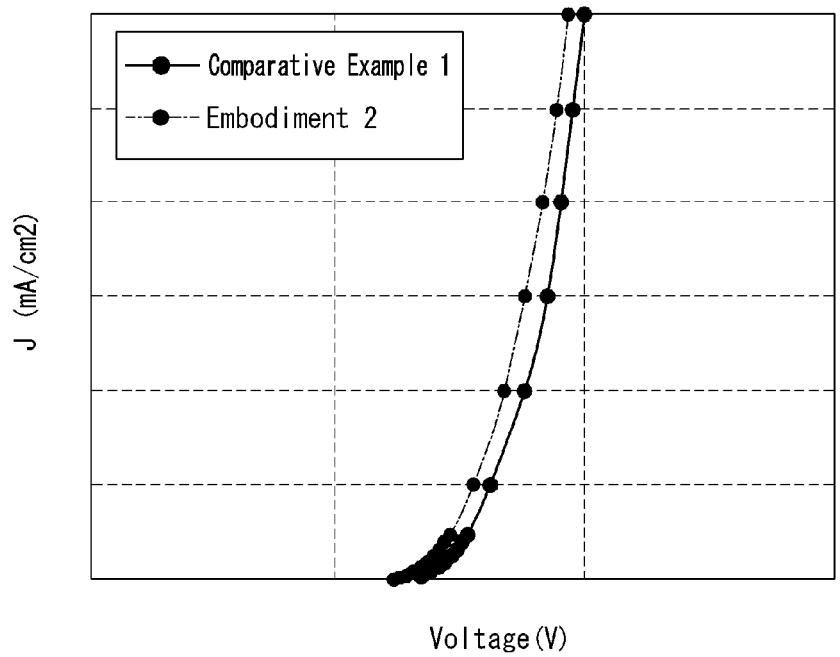
FIG. 5 is a graph of the current density vs. voltage of organic light emitting display devices according to Comparative Example 1 and Embodiment 2 of the present disclosure.
Figure 6:
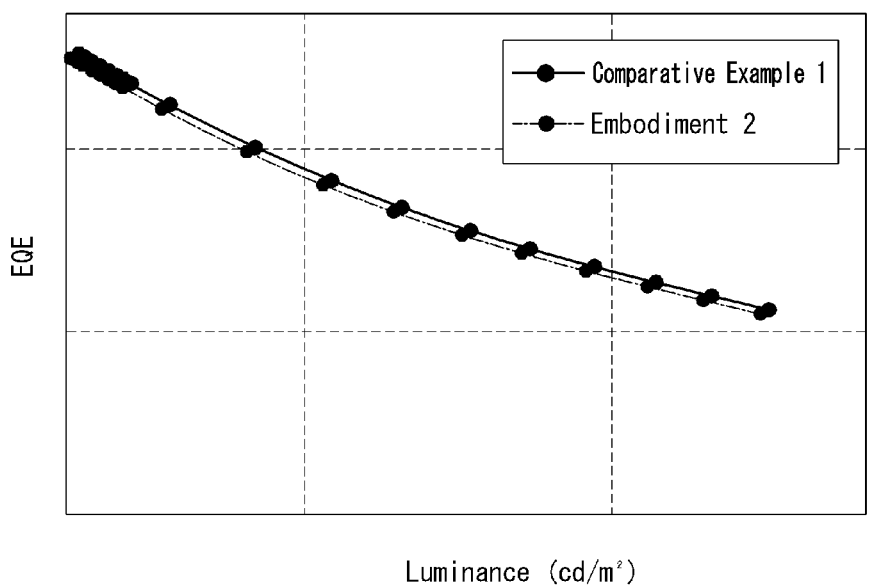
FIG. 6 is a graph of the quantum efficiency vs. luminance of organic light emitting display devices according to Comparative Example 1 and Embodiment 2 of the present disclosure.

Referring to Table 1 and FIGS. 5 and 6, Embodiment 2 using a triazine compound as the electron transport layer and a phenanthroline compound as the N-type charge generation layer showed a 6% decrease in operating voltage and a 55% increase in lifetime, compared to Comparative Example 1 using an anthracene compound as the electron transport layer and a phenanthroline compound as the N-type charge generation layer.

FIG. 5 shows the current density vs. voltage, from which it can be seen that Embodiment 2 had a reduction in operating voltage, compared to Comparative Example 1. FIG. 6 shows the quantum efficiency vs. luminance, from which it can be seen that Embodiment 2 had an improvement in quantum efficiency compared to Comparative Example 1. In view of this, it can be seen that the reduction in operating voltage and the improvement in lifetime were achieved by comprising an N-type charge generation layer of a phenanthroline compound, different from that used in Embodiment 1, along with an electron transport layer of a triazine compound.

COMPARATIVE EXAMPLE 2

It has the same elements as the above-described Comparative Example 1, and the first electron transport layer was formed of the following Compound ETL_A and the N-type charge generation layer was formed of the following Compound N-CGL_1.

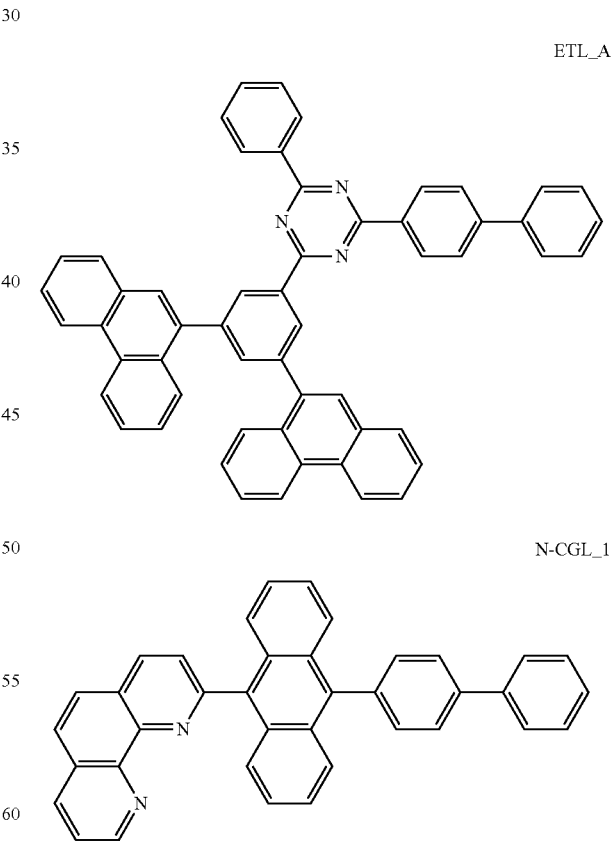

<Embodiment 3>

It has the same elements as the above-described Comparative Example 2, and the N-type charge generation layer was formed of the following Compound N-CGL_2.

N-CGL_2

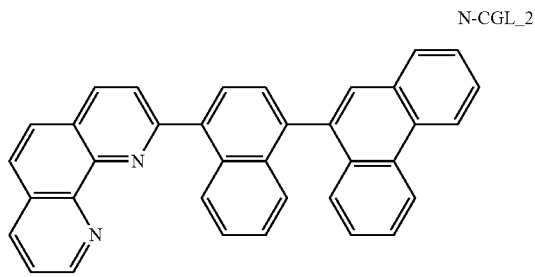 [SMILES: c1ccc2c(c1)cc(-c1ccc(-c3ccc4ccc5cccnc5c4n3)c3ccccc13)c1ccccc12]

<Embodiment 4>
It has the same elements as the above-described Comparative Example 2, and the first electron transport layer was formed of the following Compound ETL_B and the N-type charge generation layer was formed of the following Compound N-CGL_2.

ETL_B

N-CGL_2

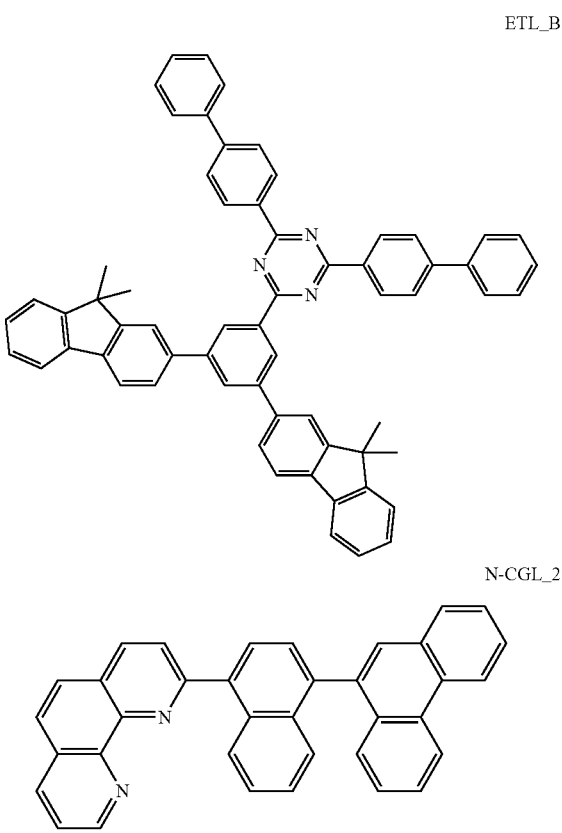

The materials for the electron transport layer and N-type charge generation layer in the above Comparative Example 2 and Embodiments 3 and 4 do not limit the scope of the present disclosure.

The operating voltage, quantum efficiency, and lifetime of the devices manufactured according to the above-described Comparative Example 2 and Embodiments 3 and 4 were measured and shown in the following Table 2. (The measurements taken in Embodiments 3 and 4 were expressed as a percentage relative to those taken in Comparative Example 2 corresponding to 100%, and the devices manufactured according to Comparative Example 2 and Embodiments 3 and 4 were driven at an operating current density of 10 mA/cm$^2$).

Figure 7:
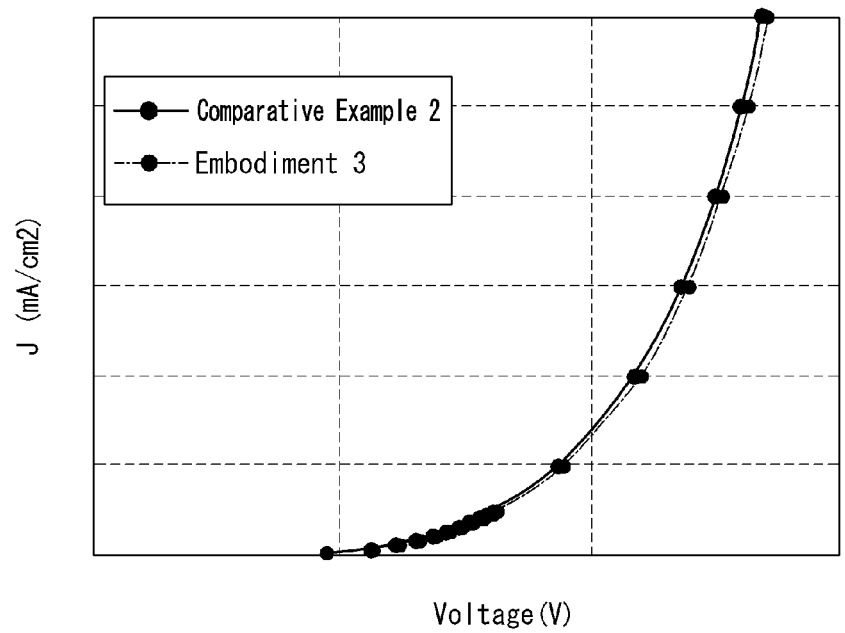
FIG. 7 is a graph of the current density vs. voltage of organic light emitting display devices according to Comparative Example 2 and Embodiment 3 of the present disclosure.
Figure 8:
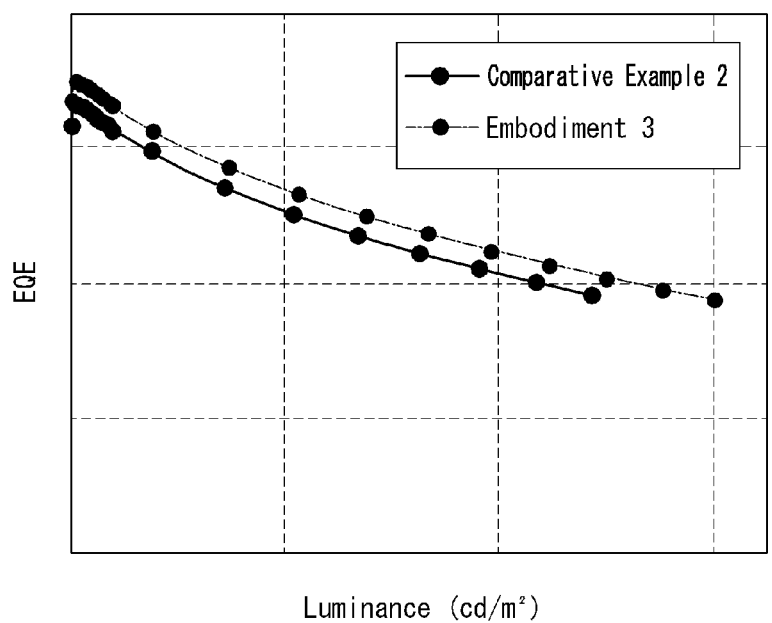
FIG. 8 is a graph of the quantum efficiency vs. luminance of organic light emitting display devices according to Comparative Example 2 and Embodiment 3 of the present disclosure.

The current density vs. voltage of the organic light emitting display devices manufactured according to Comparative Example 2 and Embodiment 3 was measured and shown in FIG. 7, and the quantum efficiency vs. luminance was measured and shown in FIG. 8. Also, the current density vs. voltage of the organic light emitting display devices manufactured according to Comparative Example 2 and Embodiment 4 was measured and shown in FIG. 9, and the quantum efficiency vs. luminance was measured and shown in FIG. 10.

TABLE 2

|  | Operating Voltage | Quantum efficiency | Lifetime |
|---|---|---|---|
| Comparative Example 2 | 100% | 100% | 100% |
| Embodiment 3 | 100% | 103% | 163% |
| Embodiment 4 | 97% | 100% | 133% |

Referring to Table 2 and FIGS. 7 and 8, Embodiment 3 using a triazine compound as the electron transport layer and a phenanthroline compound as the N-type charge generation layer showed a 3% increase in quantum efficiency and a 63% increase in lifetime, compared to Comparative Example 2 using a triazine compound as the electron transport layer and a phenanthroline compound as the N-type charge generation layer. Here, the phenanthroline compound of Comparative Example 2 has a structure in which anthracene is attached to phenanthroline, and the phenanthroline compound of Embodiment 3 has a structure in which biphenyl is attached to phenanthroline and anthracene is attached to the biphenyl.

FIG. 7 shows the current density vs. voltage, from which it can be seen that Comparative Example 2 and Embodiment 3 had the same operating voltage. FIG. 8 shows the quantum efficiency vs. luminance, from which it can be seen that Embodiment 3 had an improvement in quantum efficiency compared to Comparative Example 2. In view of this, it can be seen that the increase in quantum efficiency and the improvement in lifetime were achieved by comprising an electron transport layer of a triazine compound, along with an N-type charge generation layer of a phenanthroline compound with a structure in which biphenyl is attached to phenanthroline and anthracene is attached to the biphenyl.

Figure 9:
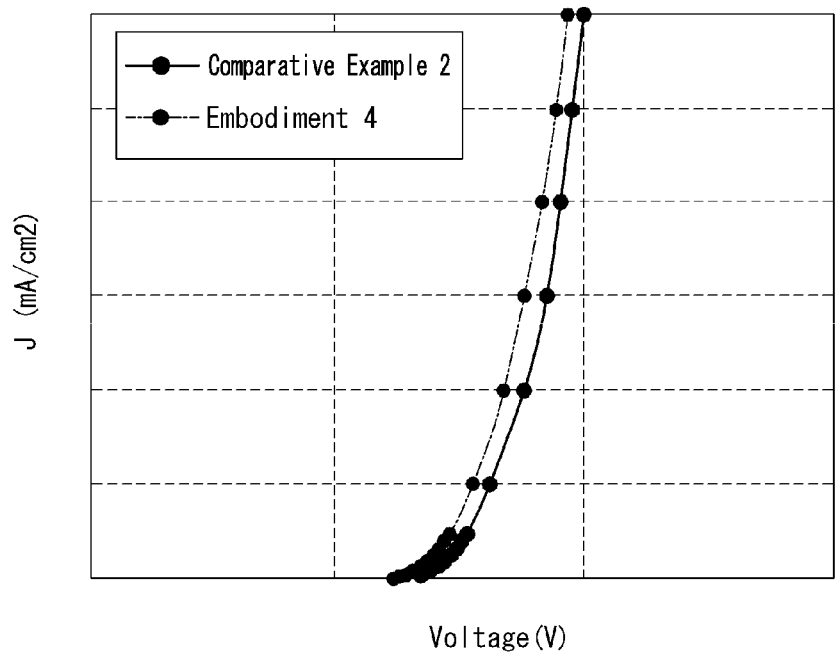
FIG. 9 is a graph of the current density vs. voltage of organic light emitting display devices according to Comparative Example 2 and Embodiment 4 of the present disclosure.
Figure 10:
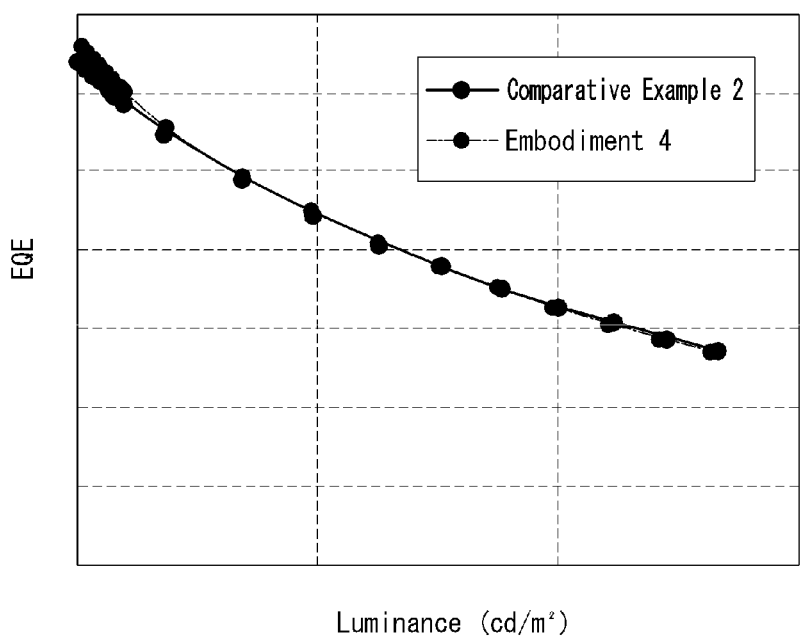
FIG. 10 is a graph of the quantum efficiency vs. luminance of organic light emitting display devices according to Comparative Example 2 and Embodiment 4 of the present disclosure.

Referring to Table 2 and FIGS. 9 and 10, Embodiment 4 using a triazine compound as the electron transport layer and a phenanthroline compound as the N-type charge generation layer showed a 3% decrease in operating voltage and a 33% increase in lifetime, compared to Comparative Example 2 using a triazine compound as the electron transport layer and a phenanthroline compound as the N-type charge generation layer.

FIG. 9 shows the current density vs. voltage, from which it can be seen that Embodiment 4 had a reduction in operating voltage, compared to Comparative Example 2. FIG. 10 shows the quantum efficiency vs. luminance, from which it can be seen that Comparative Example 2 and Embodiment 4 had the same quantum efficiency. In view of this, it can be seen that the reduction in operating voltage and the improvement in lifetime were achieved by using an electron transport layer of a triazine compound, different from that used in Embodiment 3, along with an N-type charge generation layer of a phenanthroline compound with a structure in which biphenyl is attached to phenanthroline and anthracene is attached to the biphenyl.

From these results, it can be found out that the use of a triazine compound of this disclosure as the electron transport layer and the use of a phenanthroline compound of this disclosure as the N-type charge generation layer reduced the operating voltage of the device and increased the efficiency or lifetime of the device. Accordingly, it can be concluded that the organic light emitting display device using the electron transport layer and N-type charge generation layer comprising the compounds of this disclosure improves electron injection toward a first electrode and hole injection toward a second electrode, compared to the organic light emitting display device using the electron transport layer and N-type charge generation layer not comprising these compounds, thereby leading to a relative reduction in operating voltage and a relative increase in lifetime.

As stated above, an electron transport compound included in an electron transport layer of this disclosure makes electron transport from the electron transport layer to the light emitting layer easy by comprising a functional group with high electron mobility.

Moreover, the electron transport compound may increase the thermal stability of the material by introducing a p-biphenyl group on a triazine core, thereby preventing material decomposition while the device is operating.

In addition, the p-biphenyl group used in the electron transport compound of this disclosure has high electron mobility, so it helps electrons move in balance with the transport rate of holes, which have higher mobility than electrons, thereby improving the electrical stability of the device. Accordingly, the electron transport compound of this disclosure may improve the thermal stability and electrical stability of the compound by introducing a p-biphenyl group on the triazine core, thereby allowing for stable operation of the device and improving the lifetime of the device.

Furthermore, a charge generation compound included in the N-type charge generation layer of this disclosure makes the energy level of the N-type charge generation layer match the energy level of an electron transport layer formed of a p-biphenyltriazine compound by introducing a naphthyl group on a phenanthroline ring, thereby making electron movement easy. Moreover, the charge generation compound facilitates the transport of electrons by the presence of an aromatic ring in the molecule. In addition, the mobility of electrons within the N-type charge generation layer may be improved by introducing an aryl group with at least three or more rings to the naphthyl group used on the phenanthroline core.

Besides, the organic light emitting display device of this disclosure comprises an electron transport layer including a triazine compound and an N-type charge generation layer including a phenanthroline compound, thereby improving the interface characteristics of the electron transport layer and N-type charge generation layer and facilitating the movement of electrons from the N-type charge generation layer to the electron transport layer. This allows for stable operation of the device, thereby reducing the operating voltage and improving the lifetime.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
at least two or more light emitting parts each comprising a light emitting layer and an electron transport layer; and
a charge generation layer between the at least two or more light emitting parts and including an N-type charge generation layer,
wherein the electron transport layer includes an electron transport compound having a functional group with high electron mobility, and the N-type charge generation layer includes a charge generation compound including a functional group for matching the energy level of the electron transport compound,
wherein the electron transport compound includes a triazine compound, and
wherein the charge generation compound is represented by the following Chemical Formula 2:

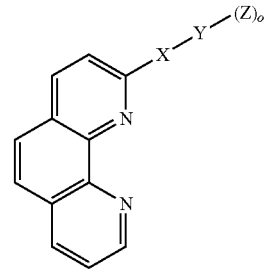

[Chemical Formula 2]

wherein X includes a substituted or unsubstituted naphthyl group, Y includes a substituted or unsubstituted aryl group with at least three or more ring structures, Z includes a phenyl group that is substituted or unsubstituted by an alkyl group, an aryl group, or a heteroaryl group, and o is 0 or 1.

2. The organic light emitting display device of claim 1, wherein the functional group with high electron mobility comprises a p-biphenyl group.

3. The organic light emitting display device of claim 1, wherein the charge generation compound further comprises a functional group with high electron mobility.

4. The organic light emitting display device of claim 1, wherein the electron transport layer and the N-type charge generation layer adjoin each other.

5. The organic light emitting display device of claim 1, wherein the electron transport layer is represented by the following Chemical Formula 1:

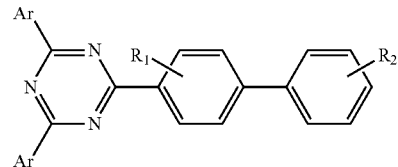

[Chemical Formula 1]

wherein Ar includes a substituted or unsubstituted aryl group of 6 to 30 carbon atoms, $R_1$ and $R_2$ include independently one among a substituted or unsubstituted alkyl group of 1 to 6 carbon atoms, a substituted or unsubstituted cycloalkyl group of 1 to 6 carbon atoms, and a substituted or unsubstituted aryl group of 6 to 30 carbon atoms.
6. The organic light emitting display device of claim 5, wherein Ar includes one among the following compounds:
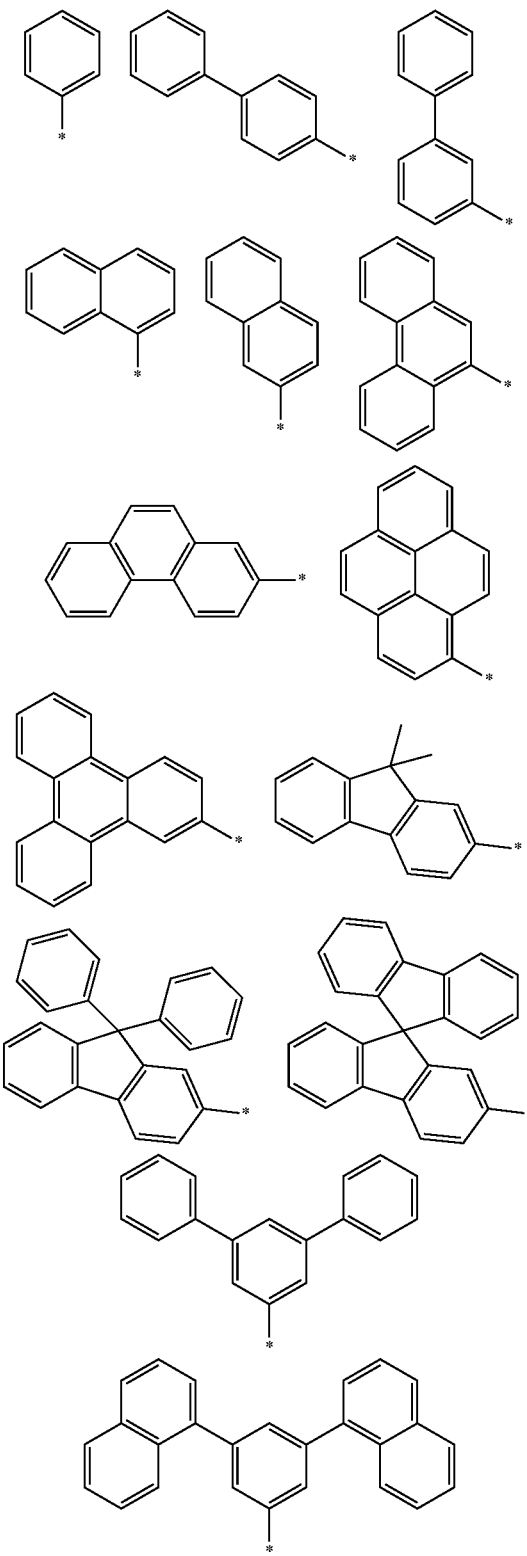
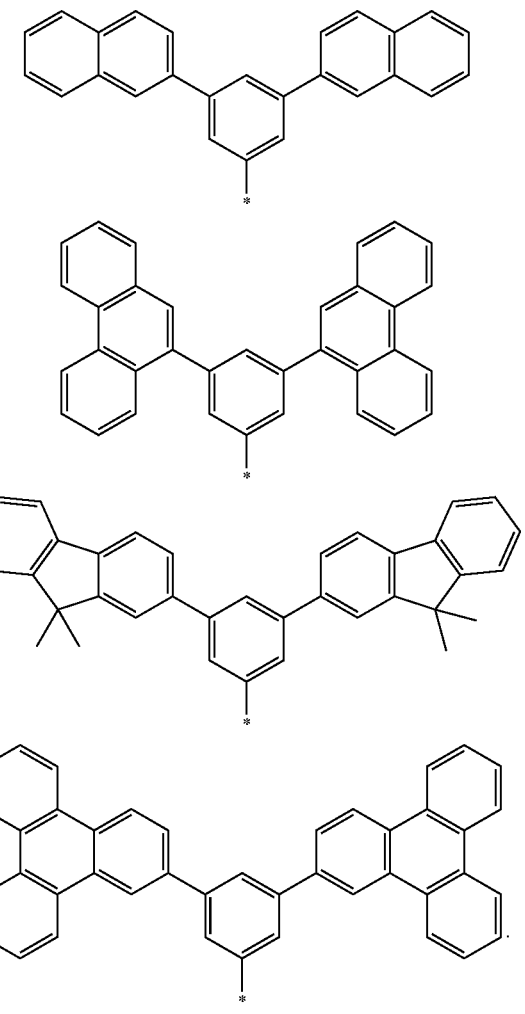
7. The organic light emitting display device of claim 5, wherein $R_1$ and $R_2$ include independently one among the following structures:
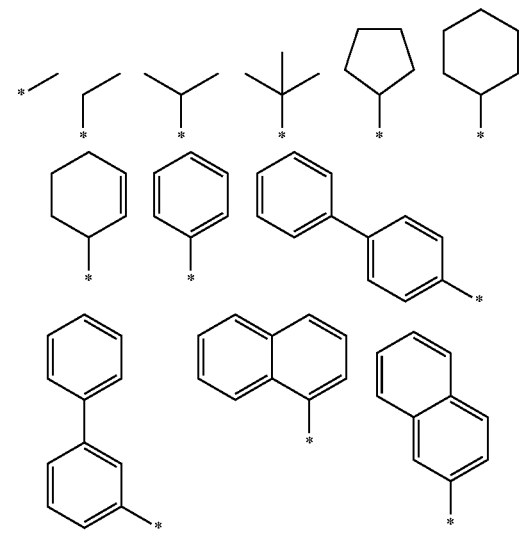

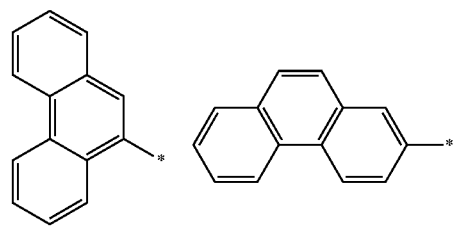
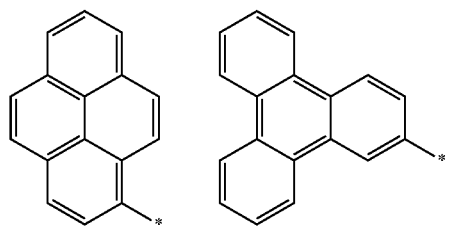
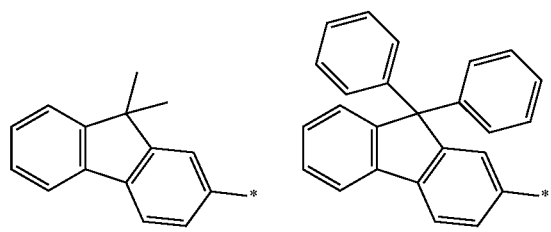
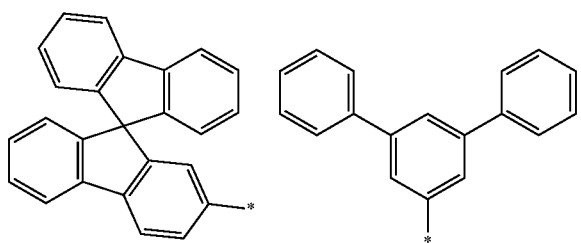
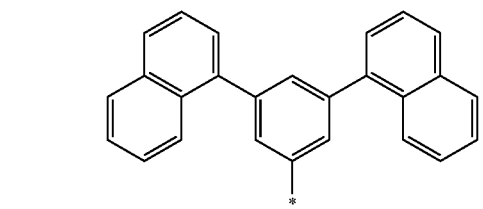
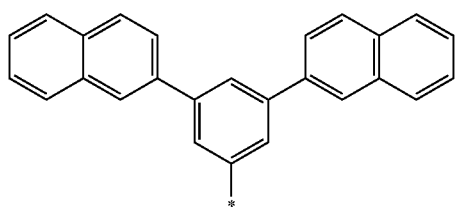
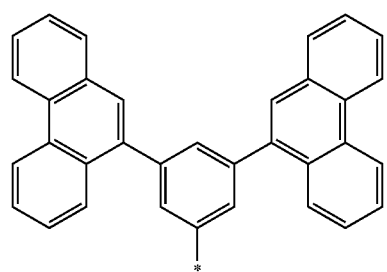
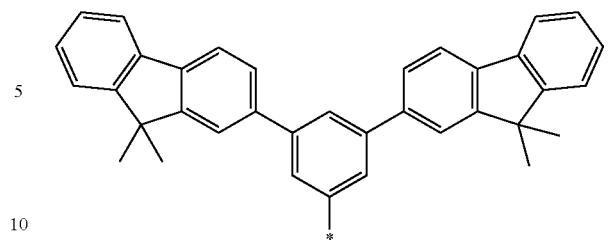
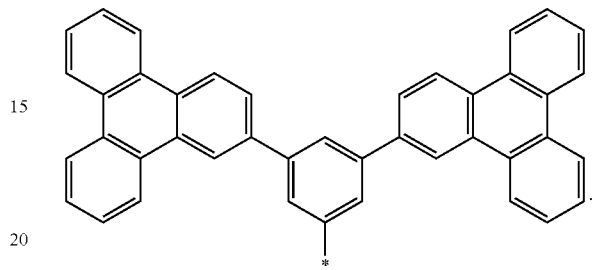
8. The organic light emitting display device of claim 5, wherein the compound represented by Chemical Formula 1 includes one among the following compounds:
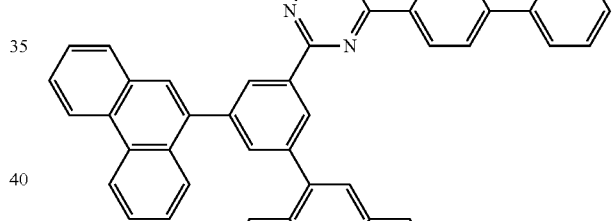
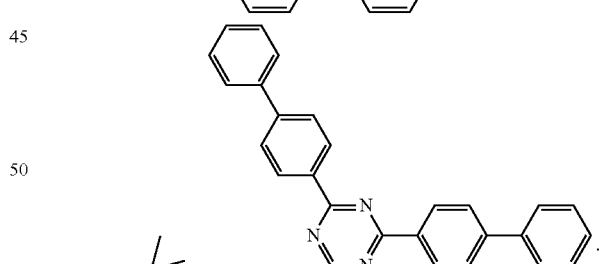
9. The organic light emitting display device of claim 1, wherein X includes one among the following compounds:

10. The organic light emitting display device of claim 1, wherein Y includes one among the following compounds:

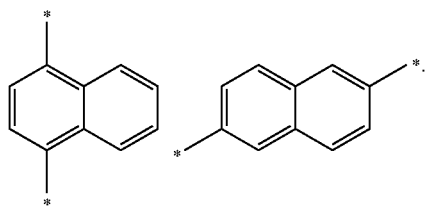

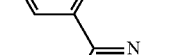

11. The organic light emitting display device of claim 1, wherein the charge generation compound represented by Chemical Formula 2 is one among the following compounds:

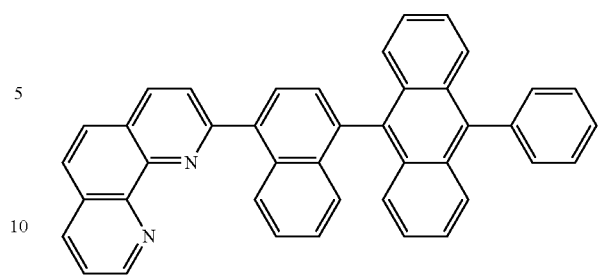

12. The organic light emitting display device of claim 1, wherein the electron transport layer is the following compound:

and wherein the charge generation compound represented by Chemical Formula 2 is the following compound:

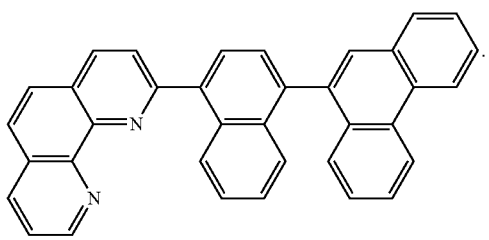 [SMILES: c1ccc2c(c1)cc(-c1ccc(-c3ccc4ccc5cccnc5c4n3)c3ccccc13)c1ccccc12]

* * * * *